(12) United States Patent
Watanabe

(10) Patent No.: US 9,814,139 B2
(45) Date of Patent: Nov. 7, 2017

(54) MOUNTING SUBSTRATE, MANUFACTURING METHOD FOR THE SAME, AND COMPONENT MOUNTING METHOD

(71) Applicant: Sony Corporation, Tokyo (JP)

(72) Inventor: Toshihiko Watanabe, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/124,499

(22) PCT Filed: Feb. 27, 2015

(86) PCT No.: PCT/JP2015/055785
§ 371 (c)(1),
(2) Date: Sep. 8, 2016

(87) PCT Pub. No.: WO2015/146476
PCT Pub. Date: Oct. 1, 2015

(65) Prior Publication Data
US 2017/0019996 A1 Jan. 19, 2017

(30) Foreign Application Priority Data
Mar. 27, 2014 (JP) ................ 2014-065302

(51) Int. Cl.
*H05K 1/16* (2006.01)
*H05K 1/11* (2006.01)
(Continued)

(52) U.S. Cl.
CPC ............ *H05K 1/116* (2013.01); *H01L 21/486* (2013.01); *H01L 23/49827* (2013.01);
(Continued)

(58) Field of Classification Search
CPC ...... H05K 1/116; H05K 1/115; H05K 3/3489; H05K 2201/09154; H05K 2201/0959;
(Continued)

(56) References Cited

U.S. PATENT DOCUMENTS 5,266,748 A * 11/1993 Kawakami ........... H05K 1/0218
174/260
2001/0042640 A1* 11/2001 Nakamura ............ H01L 23/057
174/262
(Continued)

FOREIGN PATENT DOCUMENTS

JP  10-126025 A  5/1998
JP  2002-324958 A  11/2002
(Continued)

OTHER PUBLICATIONS

International Preliminary Report on Patentability and English translation thereof dated Oct. 6, 2016 in connection with International Application No. PCT/JP2015/055785.
(Continued)

*Primary Examiner* — Sherman Ng
(74) *Attorney, Agent, or Firm* — Wolf, Greenfield & Sacks, P.C.

(57) ABSTRACT

A mounting substrate includes a through-hole 13 formed in a substrate 10, a first land part 21, a second land part 31, a first component attaching part 22, a second component attaching part 32, a conductive layer 14, and a filling member 15 filled into a part of the through-hole 13. A shortest distance allowable value $L_0$ from the center of the first land part 21 to a component 51 is determined on the basis of the volume $V_h$ of a part of the through-hole 15 positioned above a top surface of the filling member 15 on the side of the first land part 21, the length $L_1$ of the component 51 to be mounted to the first component attaching part 22, and the maximum allowable value of the
(Continued)

inclination of the component 51 to be mounted to the first component attaching part 22 relative to the first surface 11 of the substrate 10.

20 Claims, 17 Drawing Sheets

(51) Int. Cl.
| | |
|---|---|
| *H05K 3/34* | (2006.01) |
| *H01L 23/498* | (2006.01) |
| *H01L 21/48* | (2006.01) |
| *H05K 3/00* | (2006.01) |
| *H05K 3/40* | (2006.01) |
| *H05K 3/42* | (2006.01) |
| *H05K 1/03* | (2006.01) |
| *H01L 33/48* | (2010.01) |

(52) U.S. Cl.
CPC ............ *H05K 1/112* (2013.01); *H05K 3/0094* (2013.01); *H05K 3/3436* (2013.01); *H05K 3/3447* (2013.01); *H05K 3/3489* (2013.01); *H05K 3/4007* (2013.01); *H05K 3/42* (2013.01); *H01L 33/48* (2013.01); *H01L 2224/16227* (2013.01); *H01L 2224/16238* (2013.01); *H01L 2924/1531* (2013.01); *H01L 2924/19041* (2013.01); *H01L 2924/19042* (2013.01); *H01L 2924/19043* (2013.01); *H01L 2924/19105* (2013.01); *H05K 1/0306* (2013.01); *H05K 1/115* (2013.01); *H05K 2201/0959* (2013.01); *H05K 2201/09154* (2013.01); *H05K 2201/09863* (2013.01); *H05K 2201/10106* (2013.01); *H05K 2201/10484* (2013.01); *H05K 2203/1383* (2013.01); *H05K 2203/1394* (2013.01); *Y02P 70/613* (2015.11)

(58) Field of Classification Search
CPC .......... H05K 2201/09863; H05K 2201/10106; H05K 2201/10484; H05K 2203/1383; H05K 2203/1394; H05K 3/0094; H05K 3/4007; H05K 3/42; H05K 3/3447
See application file for complete search history.

(56) References Cited

U.S. PATENT DOCUMENTS

| | | |
|---|---|---|
| 2012/0186866 A1 | 7/2012 | Mikado et al. |
| 2013/0100628 A1* | 4/2013 | Yamaguchi .......... H01R 12/585 361/792 |
| 2014/0041923 A1* | 2/2014 | Hisada ................. H05K 1/115 174/266 |

FOREIGN PATENT DOCUMENTS

| | | |
|---|---|---|
| JP | 2002-359446 A | 12/2002 |
| JP | 2006-173251 A | 6/2006 |
| JP | 2007-103698 A | 4/2007 |
| JP | 2010-021327 A | 1/2010 |
| JP | 2010-028028 A | 2/2010 |
| JP | 2010-103406 A | 5/2010 |
| JP | 2010-123780 A | 6/2010 |
| JP | 2012-080002 A | 4/2012 |
| JP | 2013-038374 A | 2/2013 |

OTHER PUBLICATIONS

Written Opinion and English translation thereof dated Jun. 2, 2015 in connection with International Application No. PCT/JP2015/055785.

* cited by examiner

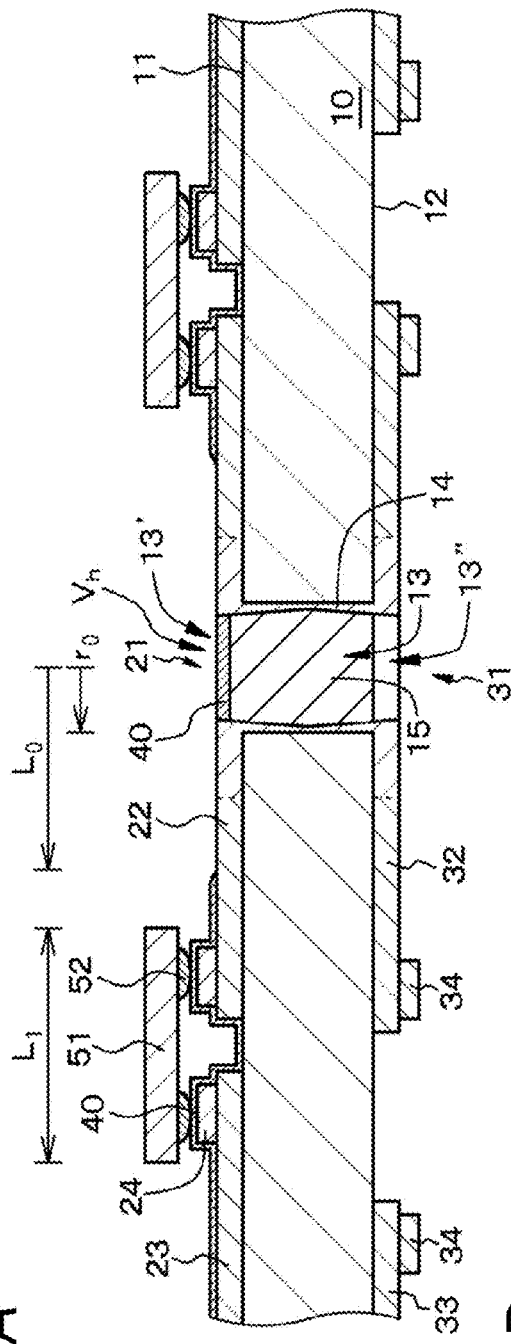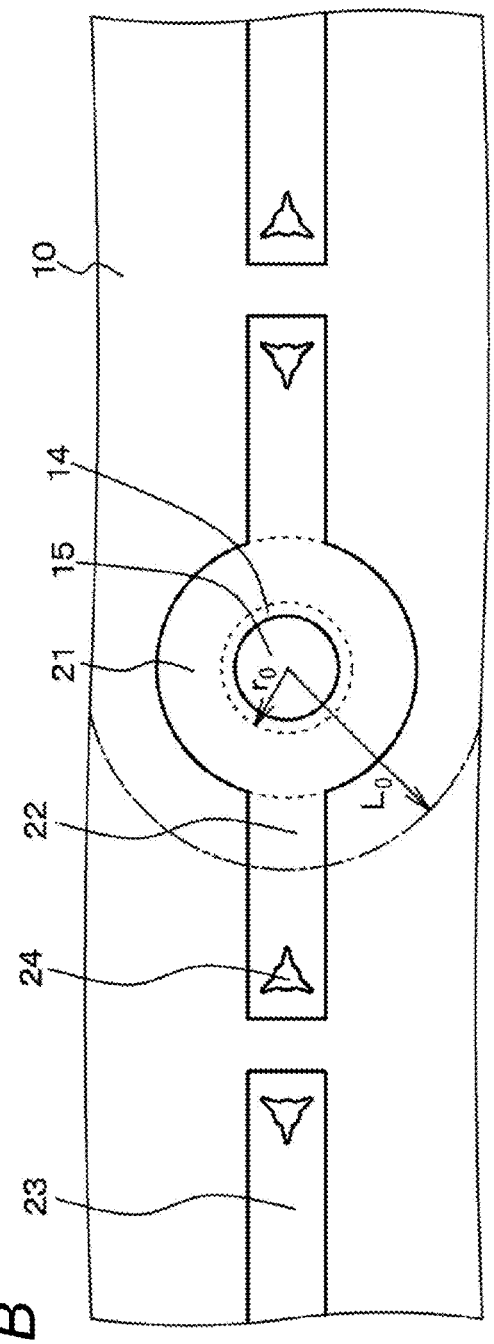

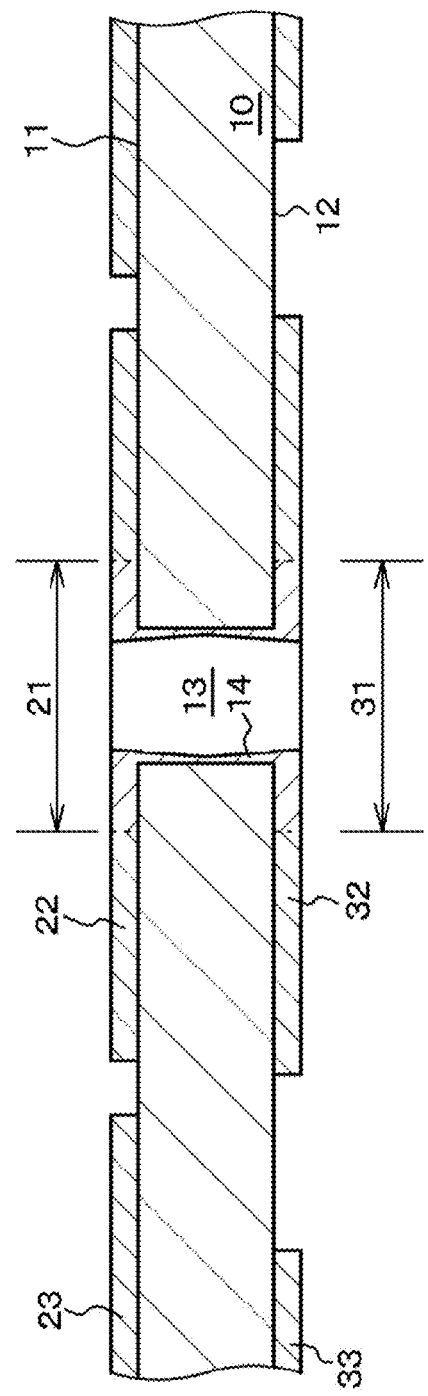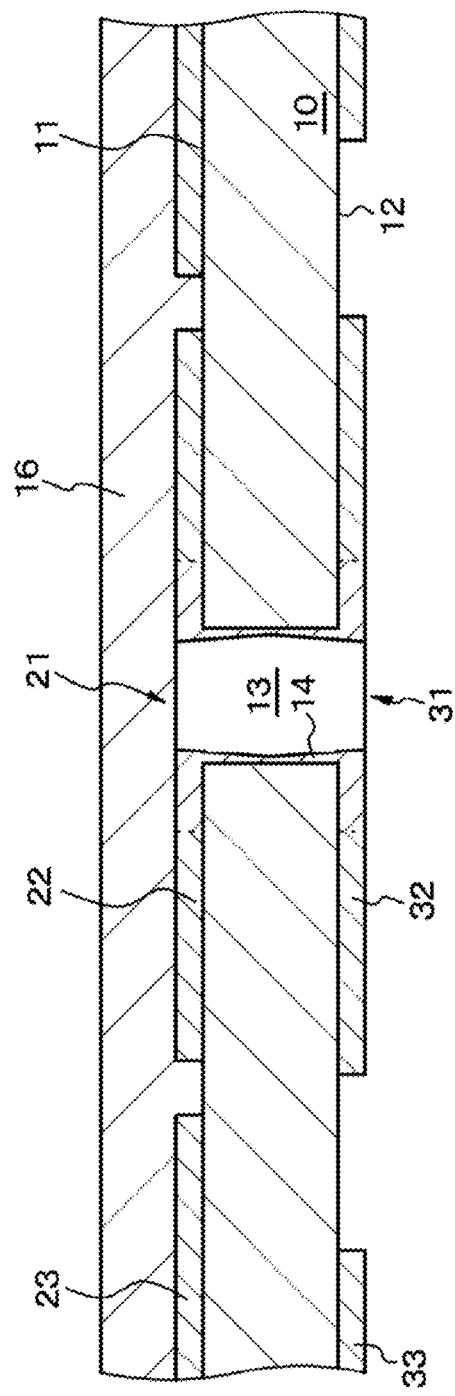

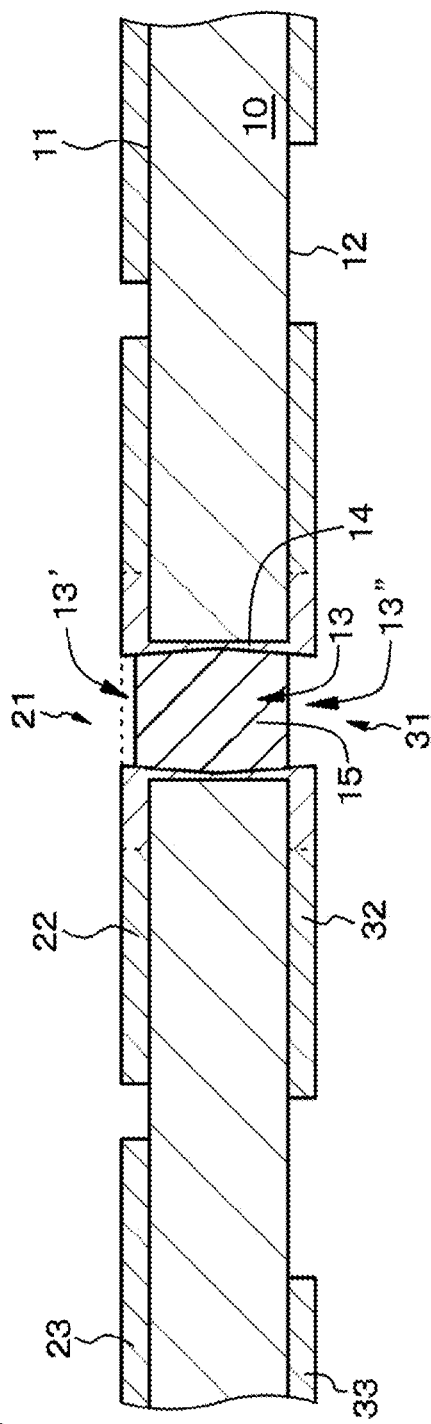
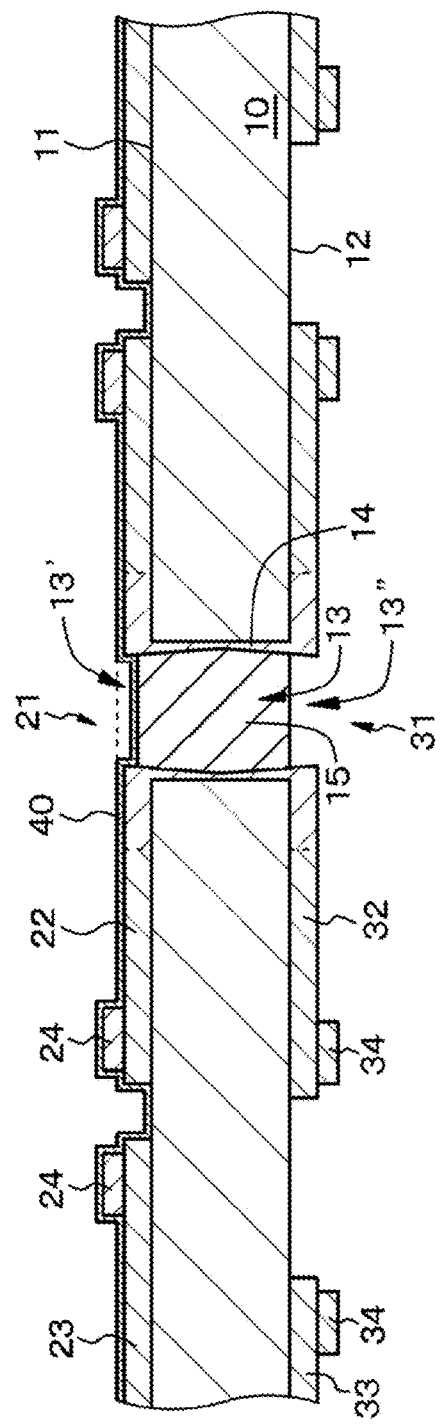
FIG. 4A
FIG. 4B

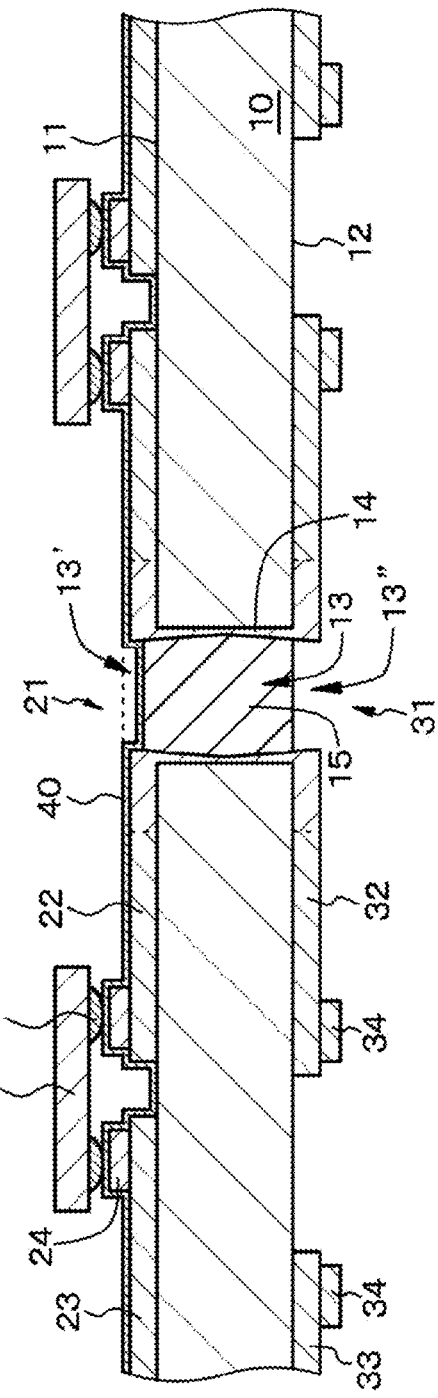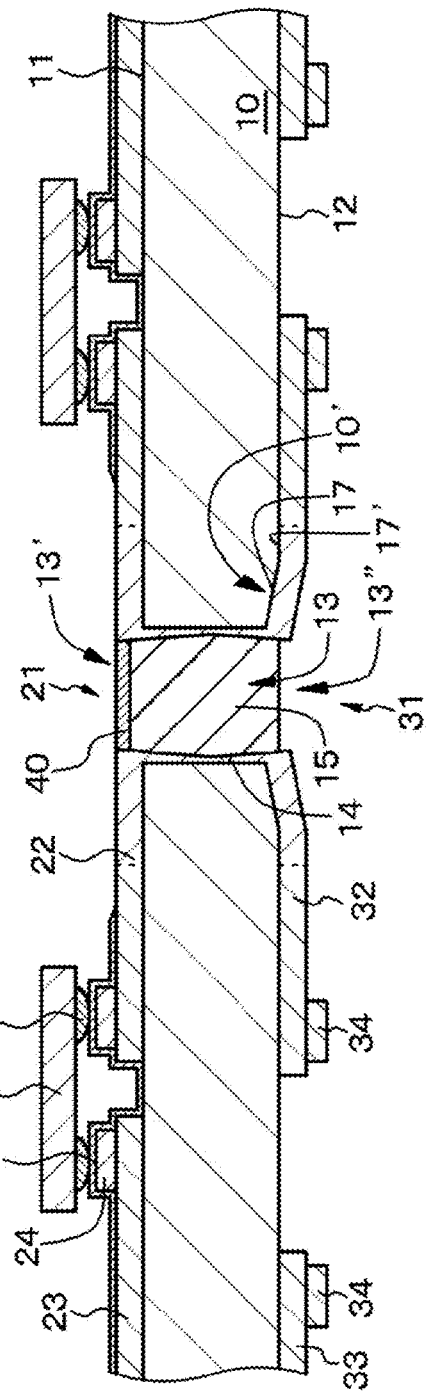
FIG. 5A
FIG. 5B

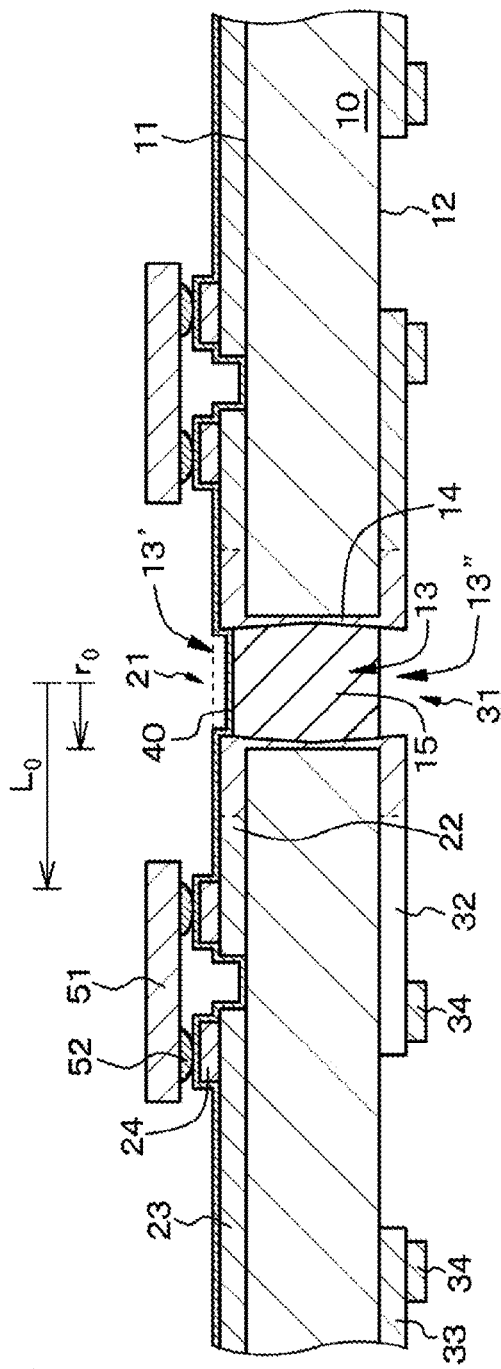
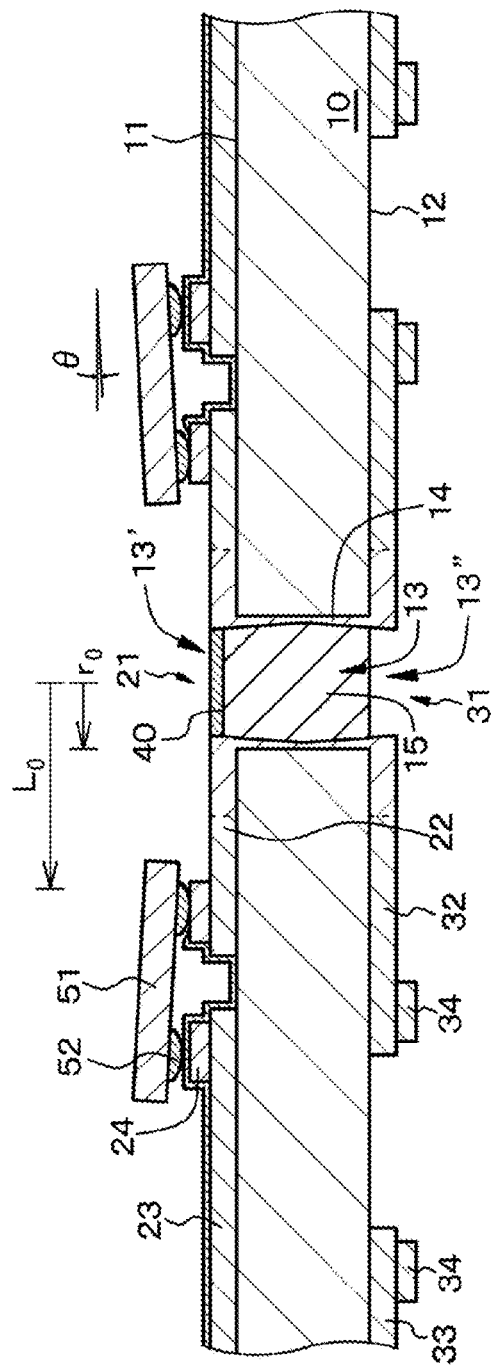
FIG. 6A
FIG. 6B

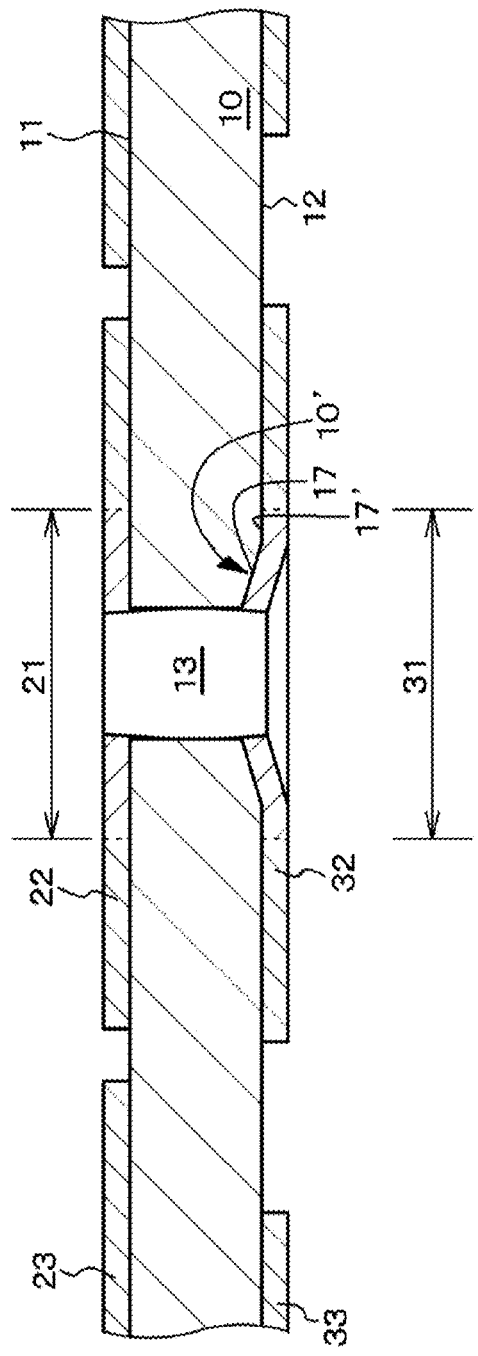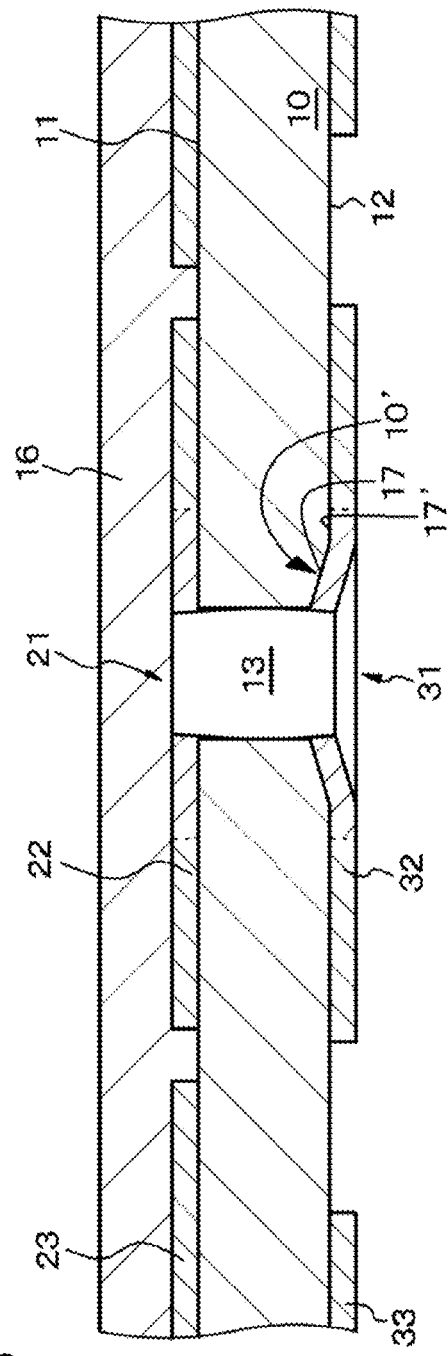
FIG. 11A
FIG. 11B

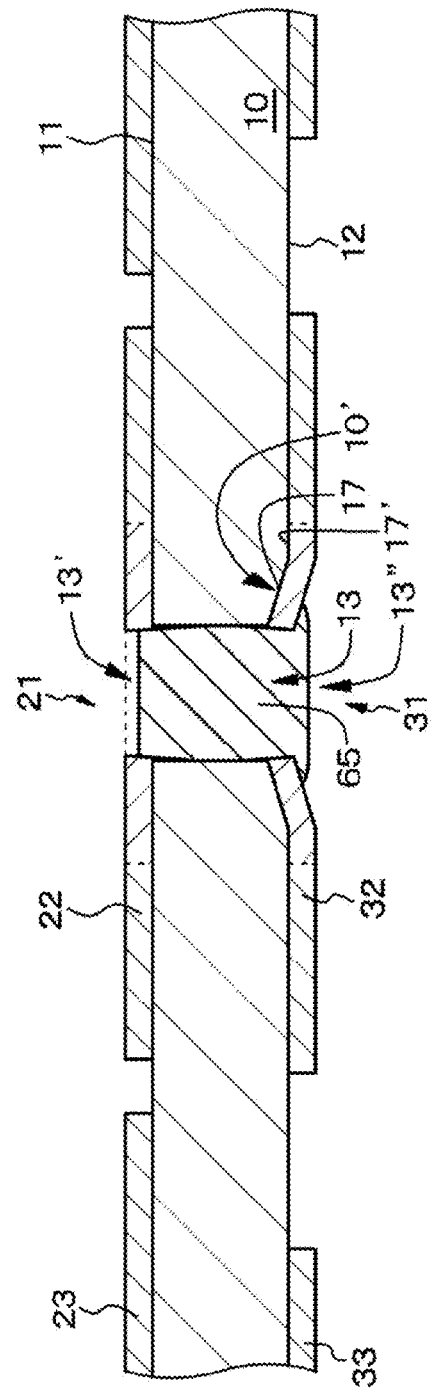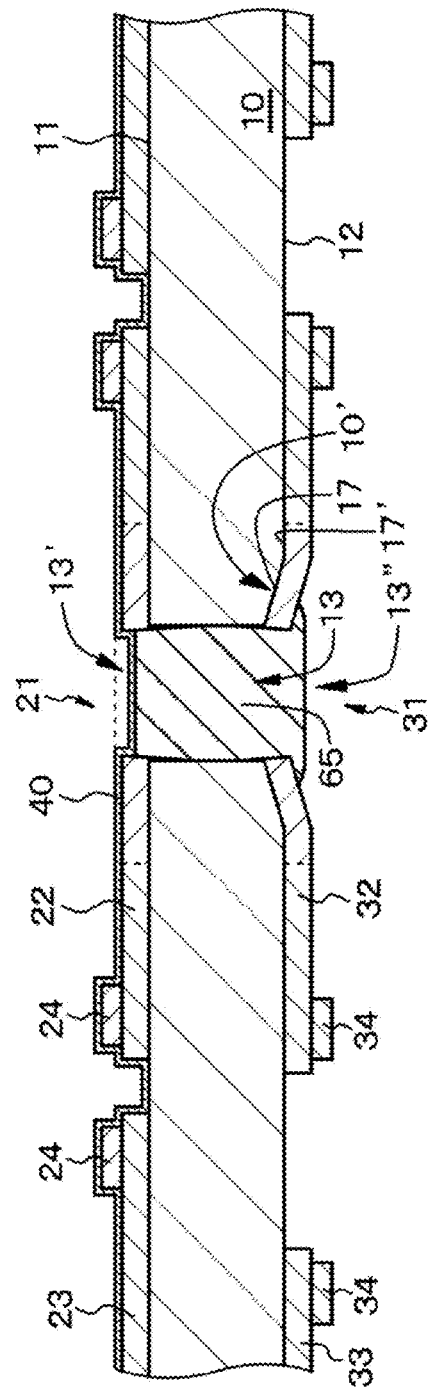
FIG. 13A
FIG. 13B

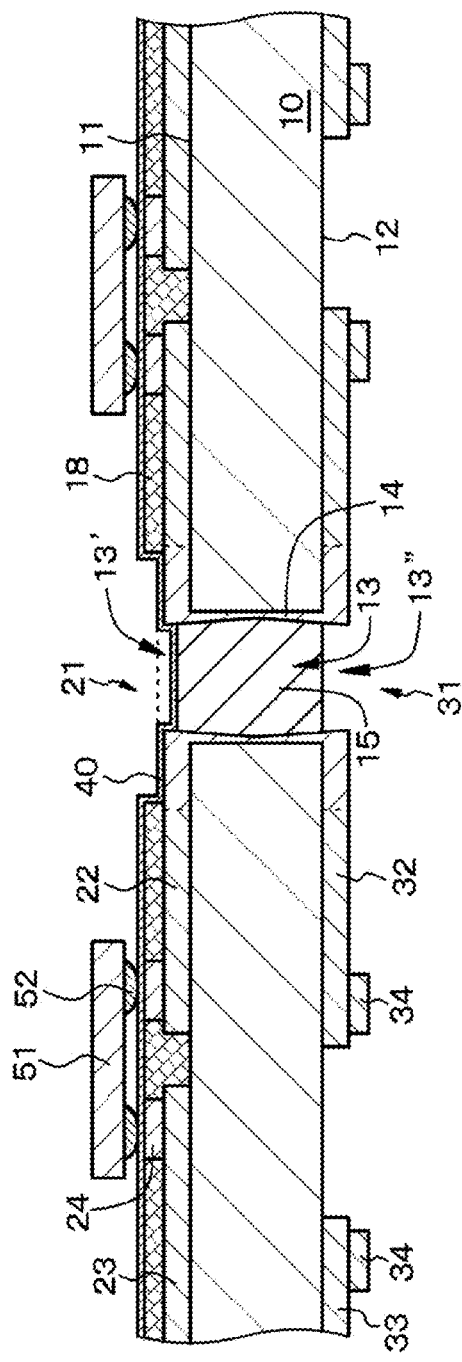
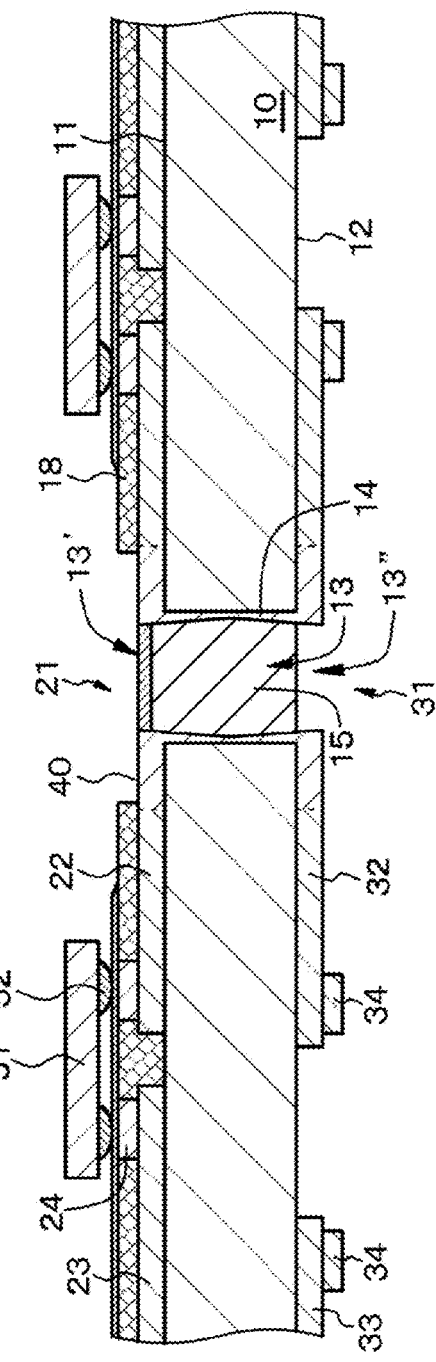
FIG. 15A
FIG. 15B

MOUNTING SUBSTRATE, MANUFACTURING METHOD FOR THE SAME, AND COMPONENT MOUNTING METHOD

CROSS REFERENCE TO RELATED APPLICATIONS

This application claims the benefit under 35 U.S.C.§371 as a U.S. National Stage Entry of International Application No. PCT/JP2015/055785, filed in the Japanese Patent Office as a Receiving Office on Feb. 27, 2015, which claims priority to Japanese Patent Application Number JP2014-065302, filed in the Japanese Patent Office on Mar. 27, 2014, each of which is hereby incorporated by reference in its entirety.

TECHNICAL FIELD

The present disclosure relates to a mounting substrate, a manufacturing method for the same, and a component mounting method.

BACKGROUND ART

For example, in a double-sided copper-clad laminated plate for a printed wiring board (referred to as "glass epoxy copper-clad laminated plate" below) formed of glass fiber base material epoxy resin, wirings formed on both sides are normally connected with a through hole. Specifically, for example, the through hole can be obtained by forming a copper layer on an inner wall of the through-hole by using an electroless plating method and an electrolytic plating method after the through-hole has been formed in the glass epoxy copper-clad laminated plate on the basis of drill processing.

Regarding a request for mounting minute components with high density, the glass epoxy copper-clad laminated plate has poor dimensional stability. Although there is a double-sided copper-clad laminated plate for a printed wiring board with excellent dimensional stability, that is expensive. Therefore, for example, amounting substrate using a glass substrate having a thickness equal to or less than 0.5 mm has been considered. However, it is difficult to form a copper layer on the inner wall of the through-hole on the basis of the electroless plating method with good adhesion after the through-hole has been formed in the glass substrate. Instead of the electroless plating method and the electrolytic plating method, a method for filling the through-hole by using conductive paste is disclosed, for example, in Japanese Patent Application Laid-Open No. 2002-324958.

When the component is mounted on the mounting substrate, a component mounting method is often employed for melting a solder layer and mounting the component to the component attaching part via the solder layer after the solder layer has been formed on the component attaching part where the component is mounted, and subsequently, the flux has been coated. In general, the flux is partially coated to a desired position by using a printing method and the like. However, a position accuracy of the pattern formed in this way has a large tolerance of about a few dozen μm. When a connection pitch gets smaller to a few dozen μm, it is difficult to apply this method. Therefore, as a solution, a method for coating the flux to the entire surface is employed, for example, as disclosed in Japanese Patent Application Laid-Open No. 2010-123780.

CITATION LIST

Patent Document

Patent Document 1: Japanese Patent Application Laid-Open No. 2002-324958
Patent Document 2: Japanese Patent Application Laid-Open No. 2010-123780

SUMMARY OF THE INVENTION

Problems to be Solved by the Invention

Meanwhile, when the through-hole is filled with the conductive paste, the volume of the conductive paste is contracted at the time of curing the conductive paste, and a recess is generated in the top surface of the conductive paste filled into the through-hole. As a result, when the flux is coated on the entire surface and the minute components are mounted there via the solder layer, a problem can easily occur in that the flux flows into the recess in the top surface of the conductive paste and the minute component before mounting is inclined. In addition, in order to improve reliability of electrical connection between the through-hole filled with the conductive paste and a land part, it is preferable to form the conductive paste on the land part. However, there may be a problem in that the conductive paste largely projected on the land part disturbs mounting the components. When trying to remove the conductive paste largely projected on the land part on the basis of a polishing method, the glass substrate is often damaged.

Therefore, a first purpose of the present disclosure is to provide a mounting substrate having a configuration and a structure in which an inclination is hardly generated in the component when the component is mounted, a manufacturing method for the same, and a component mounting method. In addition, a second purpose of the present disclosure is to provide amounting substrate having a configuration and a structure which does not prevent a component from being mounted and a manufacturing method for the same.

Solutions to Problems

Amounting substrate according to a first or second aspect of the present disclosure to achieve the first purpose includes a through-hole formed in a substrate, a first land part which is formed on a first surface of the substrate and surrounds the through-hole, a second land part which is formed on a second surface of the substrate opposed to the first surface and surrounds the through-hole, a first component attaching part which is formed on the first surface of the substrate and is connected to the first land part (or wiring extended from the first land part), a second component attaching part which is formed on the second surface of the substrate and is connected to the second land part (or wiring extended from the second land part), a conductive layer which is formed on an inner wall of the through-hole and communicates the first land part with the second land part, and a filling member filled into a part of the through-hole. Further, the mounting substrate according to the first aspect of the present disclosure includes (Requirement-1) below. In addition, in the mounting substrate according to the second aspect of the present disclosure, the flux having the average thickness d is coated on the side of the first surface of the substrate, and a shortest distance allowable value $L_0$ is determined so as to satisfy the formula (2) in (Requirement-2) below.

(Requirement-1)

A shortest distance allowable value from the center of the first land part to the component is determined on the basis of a volume of a part of the through-hole positioned above the top surface of the filling member on the side of the first land part (a part of a recess in the top surface of the filling member on the side of the first land part), a length of a component to be mounted to the first component attaching part, and an inclination of the component to be mounted to the first component attaching part relative to the first surface of the substrate (specifically, for example, on the basis of the maximum allowable value of the inclination). In some cases, in addition, the shortest distance allowable value from the center of the first land part to the component may be determined on the basis of the thickness of the flux (specifically, for example, average thickness).

(Requirement-2)

When it is assumed that the volume of the part of the through-hole positioned above the top surface of the filling member on the side of the first land part be $V_h$ and the shortest distance allowable value from the center of the first land part to the component be $L_0$, $$\pi \cdot d \cdot L_0^2 > V_h \quad (2)$$

A mounting substrate according to a third aspect of the present disclosure to achieve the second purpose includes a through-hole formed in a substrate, a first land part which is formed on a first surface of the substrate and surrounds the through-hole, a second land part which is formed on a second surface of the substrate opposed to the first surface and surrounds the through-hole, a first component attaching part which is formed on the first surface of the substrate and is connected to the first land part, a second component attaching part which is formed on the second surface of the substrate and is connected to the second land part, and a filling member which is formed of a conductive material and is filled into the through-hole and communicates the first land part with the second land part. An inclined surface which is inclined toward the through-hole is formed in apart of the substrate positioned below the second land part.

A mounting substrate manufacturing method according to the first or second aspect of the present disclosure to achieve the first purpose includes a step for forming a first land part which surrounds a through-hole on a first surface of a substrate and a first component attaching part connected to the first land part after the through-hole has been formed in the substrate, a step for forming a second land part which surrounds the through-hole on a second surface of the substrate opposed to the first surface and a second component attaching part connected to the second land part, a step for forming a conductive layer which communicates the first land part with the second land part on an inner wall of the through-hole, and a step for subsequently filling a part of the through-hole with a filling member. Further, the mounting substrate according to the first aspect of the present disclosure includes (Requirement-1) described above. In addition, the mounting substrate according to the second aspect of the present disclosure includes a step for coating the flux having the average thickness d on the side of the first surface of the substrate after a part of the through-hole has been filled with the filling member. The shortest distance allowable value $L_0$ is determined so as to satisfy the formula (2) in (Requirement-2).

A mounting substrate manufacturing method according to the third aspect of the present disclosure to achieve the second purpose includes a step for forming a first land part, which surrounds a through-hole, on a first surface of a substrate and a first component attaching part connected to the first land part after the through-hole has been formed in the substrate, a step for forming a second land part, which surrounds the through-hole, on a second surface of the substrate opposed to the first surface and a second component attaching part connected to the second land part, and a step for communicating the first land part with the second land part by filling the through-hole with a filling member formed of a conductive material. An inclined surface which is inclined toward the through-hole is formed in apart of the substrate where the second land part is formed.

A component mounting method according to the first or second aspect of the present disclosure to achieve the first purpose includes a step for forming a first land part, which surrounds a through-hole, on a first surface of a substrate and a first component attaching part connected to the first land part after the through-hole has been formed in the substrate, a step for forming a second land part, which surrounds the through-hole, on a second surface of the substrate opposed to the first surface and a second component attaching part connected to the second land part, a step for forming a conductive layer, which communicates the first land part with the second land part, on an inner wall of the through-hole, a step for subsequently forming a solder layer or a solder diffusion prevention layer on apart of the first component attaching part where the component is mounted after a part of the through-hole has been filled with the filling member, a step for subsequently coating flux on the side of the first surface of the substrate, and a step for mounting the component to the part of the first component attaching part where the component is mounted via the solder layer and the solder diffusion prevention layer. Further, the mounting substrate according to the first aspect of the present disclosure includes (Requirement-1) described above. In addition, in the mounting substrate according to the second aspect of the present disclosure, the flux having the average thickness d is coated, and the shortest distance allowable value $L_0$ is determined so as to satisfy the formula (2) in (Requirement-2).

Effects of the Invention

The mounting substrate according to the first aspect of the present disclosure, the manufacturing method for the same, and the component mounting method include (Requirement-1). In the mounting substrate according to the second aspect of the present disclosure, the manufacturing method for the same, and the component mounting method, the shortest distance allowable value $L_0$ is determined so as to satisfy the formula (2) in (Requirement-2). Therefore, when apart of the through-hole is filled with the filling member, the volume of the filling member is contracted, and a recess is generated in the top surface of the filling member filled into the through-hole. Even in this case, when the flux is coated on the entire surface and the minute components are mounted vie the solder layer or the solder diffusion prevention layer, a problem can be surely prevented in that the flux flows into the recess in the top surface of the filling member and the minute component before mounting is inclined. In the mounting substrate according to the third aspect of the present disclosure and the manufacturing method for the same, since an inclined surface which is inclined toward the through-hole is formed in apart of the substrate positioned below the second land part, reliability of electrical connection between the filling member and the second land part can be improved. Since it is not necessary to largely project the filling member on the land part, it is not necessary to remove the filling member by polishing it. A problem does not occur in that the substrate is damaged. Note that the effects described herein are only exemplary and not limited to these. In addition, there may be an additional effect.

BRIEF DESCRIPTION OF DRAWINGS

FIGS. 1A and 1B are a schematic partial sectional diagram of a mounting substrate according to a first embodiment after components are mounted and a schematic partial plan view of the mounting substrate according to the first embodiment after a part of a through-hole is filled with a filling member.

FIGS. 2A and 2B are a schematic partial sectional diagram of the mounting substrate according to the first embodiment after the through-hole and the like have been formed in a substrate and a schematic partial sectional diagram of the mounting substrate according to the first embodiment before the through-hole is filled with the filling member.

FIGS. 4A and 4B are a schematic partial end view of the mounting substrate according to the first embodiment after the through-hole has been filled with the filling member and a schematic partial end view of the mounting substrate according to the first embodiment in a state where a first surface of the substrate is coated with flux.

FIGS. 5A and 5B are a schematic partial end view of the mounting substrate according to the first embodiment in a state where a first component is attached on a first component attaching part and a schematic partial end view of a modification of the mounting substrate according to the first embodiment illustrated in FIGS. 1A and 1B.

FIGS. 6A and 6B are schematic partial end views of a traditional mounting substrate of a state where the flux coated on the first surface of the substrate is flown into apart (space) of a through-hole positioned above a top surface of the filling member on the side of a first land part.

FIGS. 11A and 11B are a schematic partial sectional diagram of the mounting substrate according to the second embodiment after a through-hole and the like have been formed in a substrate and a schematic partial sectional diagram of the mounting substrate according to the second embodiment before the through-hole is filled with a filling member.

FIGS. 13A and 13B are a schematic partial end view of the mounting substrate according to the second embodiment after the through-hole has been filled with the filling member and a schematic partial end view of the mounting substrate according to the second embodiment in a state where a first surface of a substrate is coated with flux.

FIGS. 15A and 15B are a schematic partial end view of a mounting substrate according to another modification of the first embodiment after the components have been mounted in a state where the first surface of the substrate is coated with the flux and a schematic partial end view of the mounting substrate according to another modification in a state where the components have been mounted.

MODE FOR CARRYING OUT THE INVENTION

Figure 3A:
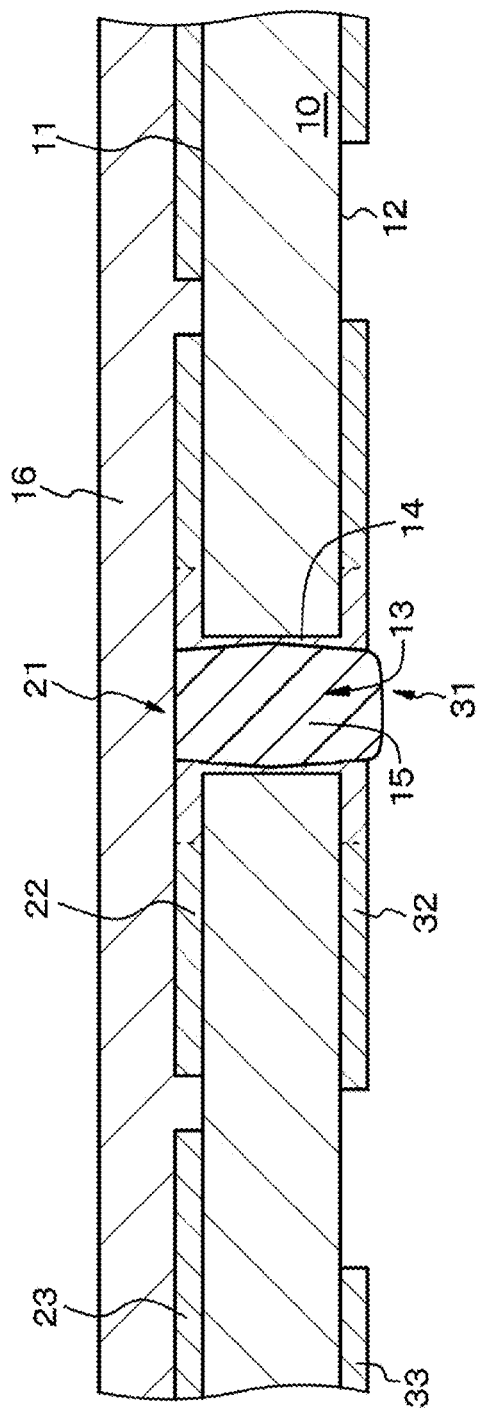
FIGS. 3A and 3B are schematic partial sectional diagrams of the mounting substrate according to the first embodiment after the through-hole has been filled with the filling member.
Figure 3B:
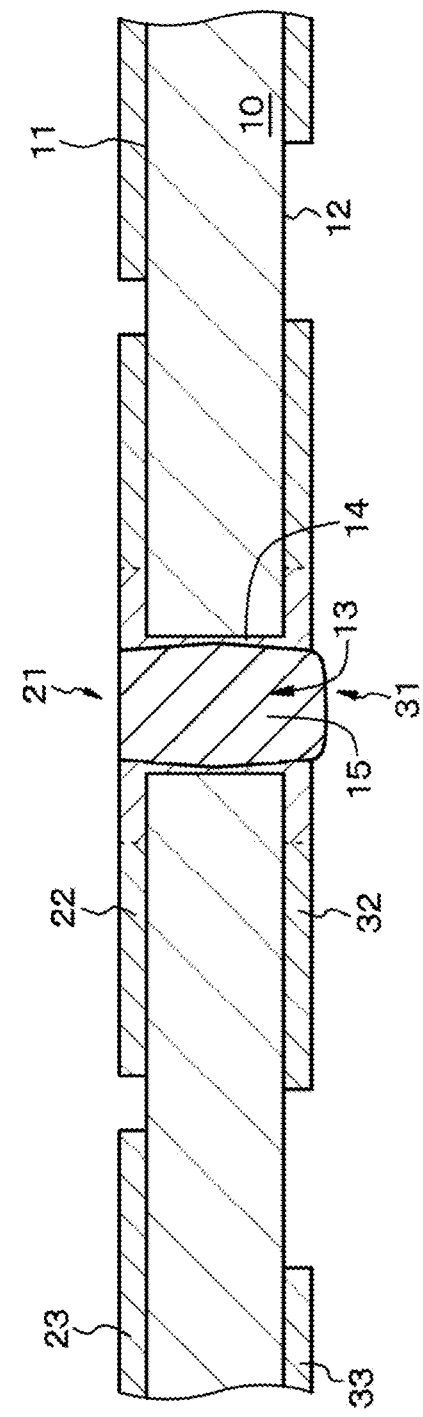

The present disclosure will be described below on the basis of the embodiments with reference to the drawings. However, the present disclosure is not limited to the embodiments, and various values and materials in the embodiments are exemplary. Note that the description will be made in the following order.

1. General description on the mounting substrate and manufacturing method for the same according to first to third aspects of the present disclosure and component mounting method according to first and second aspects of the present disclosure 2. First embodiment (mounting substrate and manufacturing method for the same according to first and second aspects of the present disclosure and component mounting method according to first and second aspects of the present disclosure)

3. Second embodiment (mounting substrate and manufacturing method for the same according to third aspect of the present disclosure) and others General description on mounting substrate and manufacturing method for the same according to first to third aspects of the present disclosure and component mounting method according to first and second aspects of the present disclosure In the following description, a mounting substrate according to a first aspect of the present disclosure, a manufacturing method for the same, and a component mounting method according to the first aspect of the present disclosure may be collectively referred to as a "first aspect of the present disclosure". In addition, a mounting substrate according to a second aspect of the present disclosure, a manufacturing method for the same, and a component mounting method according to the second aspect of the present disclosure may be collectively referred to as a "second aspect of the present disclosure". In addition, a mounting substrate according to a third aspect of the present disclosure and a manufacturing method for the same may be collectively referred to as a "third aspect of the present disclosure". The length of 0.01 mm to one mm can be exemplified as a value of the length $L_1$ of a component to be mounted to a first component attaching part, and the length of 0.001 μm to 0.1 μm can be exemplified as a value of the average thickness d of flux. In addition, the length of 0.01 mm to one mm can be exemplified as a value of the radius $r_0$ of a through-hole. A value of the volume $V_h$ of the part of the through-hole positioned above a top surface of a filling member on the side of a first land part (part of recess in top surface of filling member on the side of first land part) depends on the value of the radius $r_0$ of the through-hole, a material of the filling member, a method for filling the filling member, and the like.

In the first aspect of the present disclosure, when it is assumed that the volume of the part of the through-hole positioned above the top surface of the filling member on the side of the first land part (part of recess in the top surface of the filling member on the side of the first land part) in (Requirement-1) be $V_h$, that the length of the component to be mounted to the first component attaching part be $L_1$, that the inclination of the component to be mounted to the first component attaching part relative to a first surface of substrate be θ (specifically, the maximum allowable value of the inclination be $θ_{max}$), and that the shortest distance allowable value from the center of the first land part to the component be $L_0$, the shortest distance allowable value $L_0$ can be determined so as to satisfy the following formula (1). In this case, 30 degrees can be exemplified as the value of $θ_{max}$.

$$π·L_1·\sin(θ_{max})(L_1^2/3+L_1·L_0+L_0^2) > V_h \quad (1)$$

In the first more of the present disclosure including the preferred embodiment and the second aspect of the present disclosure, the first land part, a second land part, the first component attaching part, a second component attaching part, and a conductive layer can be formed of a first member formed of metal or alloy, and the filling member can be formed of a second member different from the first member. In this case, when it is assumed that the coefficient of thermal expansion of the substrate be $CTE_0$, that the coefficient of thermal expansion of the first member be $CTE_1$, and that the coefficient of thermal expansion of the second member be $CTE_2$, the aspect can be used which satisfies $CTE_2-CTE_0 < CTE_1-CTE_0$ or $CTE_0 < CTE_1 < CTE_2$. In addition, in this case, the first member can be formed of at least one kind of materials selected from a group including aluminum, aluminum alloy, nickel, nickel alloy, chrome, chromium alloy, copper, and copper alloy, and the second member can be formed of conductive paste (specifically, low temperature firing paste or thick film printing paste, and more specifically, Ag paste, Cu paste, and Ag—Pd paste). In some cases, the second member may be formed of resin having electrical conductivity or resin with no electrical conductivity. In addition, it is preferable that the electric resistance of the filling member be smaller than that of the conductive layer. In addition, it is preferable that the radius of the filling member be larger than the thickness of the conductive layer. The conductive layer can include an extending part of the first member configuring the first land part and an extending part of the first member configuring the second land part. In addition, as the filling member made of a conductive material in the third aspect of the present disclosure, conductive paste (specifically, low temperature firing paste or thick film printing paste, and more specifi- cally, Ag paste, Cu paste, and Ag—Pd paste) can be exemplified. In addition, as the resin with no electrical conductivity, epoxy resin, phenol resin, novolak resin, polyimid resin, acrylic resin, and liquid crystal polymer can be exemplified.

Typical values of $CTE_0$, $CIE_1$, and $CTE_2$ are as follows.
$CTE_0$: $3×10^{-6}$/K to $1.5×10^{-5}$/K
$CTE_1$: $3×10^{-6}$/K to $5×10^{-5}$/K
$CTE_2$: $1×10^{-5}$/K to $2×10^{-4}$/K In addition, in the manufacturing method for the mounting substrate according to the first to third aspects of the present disclosure including the preferred embodiments described above or the component mounting method according to the first and second aspects of the present disclosure, it is preferable that the first component attaching part, the first land part, the second component attaching part, the second land part, and the conductive layer be formed on the basis of a combination of the physical vapor deposition (PVD method) including a vacuum deposition method and a sputtering method and an etching technique (however, in the third aspect of the present disclosure, it is not necessary to form the conductive layer) and the through-hole be filled with the filling member on the basis of a printing method (for example, screen printing method) and a method for using a dispenser. By employing the PVD method, an excellent adhesion of the first member relative to a glass substrate can be achieved. Specifically, the etching technique includes a combination of a technique for forming a mask for etching and a wet etching technique or a dry etching technique. For example, as the technique for forming a mask for etching, forming a resist layer for etching based on a printing technique using resist ink (for example, screen printing technique), forming a resist layer for etching based on a photolithography technique using photosensitive resin, and forming a resist layer for etching using a dry film can be exemplified.

In addition, in the manufacturing method for the mounting substrate according to the first and second aspects of the present disclosure including the preferred embodiment or the component mounting method according to the first and second aspects of the present disclosure, the through-hole can be filled with the filling member in a state where a protection film is bonded to the first surface of the substrate.

In addition, in the manufacturing method for the mounting substrate according to the first and second aspects of the present disclosure including the preferred embodiment or the component mounting method according to the first and second aspects of the present disclosure, an inclined surface which is inclined toward the through-hole can be formed in a part of the substrate where the second land part is formed when the through-hole is formed. In addition, in the mounting substrate according to the first and second aspects of the present disclosure including the preferred embodiment, the inclined surface which is inclined toward the through-hole can be formed in a part of the substrate positioned below the second land part. In these cases, it is preferable that the thickness of a flat part of the land part be equal to the thickness of the inclined part of the land part.

In the third aspect of the present disclosure, it is preferable that the thickness of the second land part be equal to that of the second component attaching part. Here, the thickness of the flat part of the land part is "equal to" the thickness of the inclined part of the land part. This means that $0.8 ≤ t_1/t_2 ≤ 1.2$ is satisfied when it is assumed that the thickness of the flat part of the land part be $t_1$ and the thickness of the inclined part of the land part be $t_2$.

In addition, in the third aspect of the present disclosure including the preferred embodiment, the first surface of the substrate can include (Requirement-1), and in addition, the shortest distance allowable value $L_0$ can be determined so as to satisfy the formula (1) in (Requirement-1).

In addition, in the manufacturing method for the mounting substrate according to the third aspect of the present disclosure including the preferred embodiment, the inclined surface which is inclined toward the through-hole can be formed in the part of the substrate where the second land part is formed by etching the substrate after the through-hole has been formed. For example, it is preferable to use hydrofluoric acid for the etching to the substrate. Note that a desired inclination structure can be obtained by controlling a flow of etching solution and selecting a resist mask pattern. In addition, similarly, the inclination structure can be formed by a dry etching method and a sand blast method using a resist mask.

In addition, in the manufacturing method for the mounting substrate according to the third aspect of the present disclosure including the preferred embodiment, the through-hole can be filled with the filling member in a state where the protection film is bonded to the first surface of the substrate.

In the first to third aspects of the present disclosure including the preferred embodiment, a light emitting element and a sensor can be exemplified as a component (referred to as "first component" for convenience) to be mounted to (or mounted to) the first component attaching part. In addition, an assembly of electronic devices including the light emitting element, the sensor, and a circuit for driving them can be exemplified. A light emitting diode (LED) can be exemplified as the light emitting element. An image display apparatus can be formed by arranging a plurality of light emitting elements on the substrate in a two-dimensional matrix. The image display apparatus can be an image display apparatus of a so-called tiling format in which a plurality of mounting substrates on which the light emitting elements are arranged is arranged. Alternatively, a sensor array can be formed by arranging a plurality of sensors on the substrate. As a component (referred to as "second component" for convenience) to be mounted to (mounted to) the second component attaching part, for example, an electronic device including a circuit for driving and controlling the first component can be exemplified. A single second component may drive and control the single first component and may drive and control the plurality of first components. Note that the second component can be formed of at least one kind of components selected from a group of a semiconductor device, a transistor, a diode, a resistive element, and a capacitor element (capacity element) or a combination of them. The first component can be a composite component of the light emitting element and the sensor and various components described as the second component (formed of at least one kind of components selected from a group of a very small semiconductor device, a transistor, a diode, a resistive element, and a capacitor element (capacity element) or a combination of them, referred to as "third component" for convenience). In addition, the first component can be formed of a so-called passive element, and the substrate including the first component can be used as, for example, a kind of a switching unit (switcher) and a branching device. In some cases, the second component may be formed between a plurality of insulation layers formed on the first surface of the substrate.

When the first component is formed of the light emitting diode, the light emitting diode can be a light emitting diode having a known configuration and structure. That is, according to a luminescent color of the light emitting diode, it is preferable to select a light emitting diode which has an optimal configuration and structure and is formed of an optimal material. In the image display apparatus having the light emitting diode as a light emitting part, a light emitting part formed of a red light emitting diode functions as a red light emitting sub-pixel, and a light emitting part formed of a green light emitting diode functions as a green light emitting sub-pixel. A light emitting part formed of a blue light emitting diode functions as a blue light emitting sub-pixel. The three kinds of sub-pixels form a single pixel, and a color image can be displayed on the basis of light emission states of the three kinds of sub-pixels. When the three kinds of sub-pixels form the single pixel, a delta array, a stripe array, a diagonal array, and a rectangle array can be exemplified as an array of the three kinds of sub-pixels. For example, it is preferable to drive the light emitting diode with a constant current on the basis of the PWM driving method. In addition, three panels are prepared, and a first panel is formed of the light emitting part formed of the red light emitting diode. A second panel is formed of the light emitting part formed of the green light emitting diode, and a third panel is formed of the light emitting part formed of the blue light emitting diode. The light emitting diode can be applied to for example, a projector for collecting the light from the three panels by using a dichroic prism.

When the first component is formed of the sensor, a sensor for detecting visible light, a sensor for detecting infrared rays, a sensor for detecting ultraviolet rays, a sensor for detecting X-rays, a sensor for detecting an atmospheric pressure, a sensor for detecting a temperature, a sensor for detecting sound, a sensor for detecting vibration, a sensor for detecting acceleration, and a sensor for detecting angular acceleration (so-called gyro sensor) can be exemplified as a sensor.

In the first to third aspects of the present disclosure including the preferred embodiment, the substrate can be formed of the glass substrate. Here, as the glass substrate, specifically, high strain point glass, soda glass ($Na_2O.CaO.SiO_2$), borosilicate glass ($Na_2O.B_2O_3.SiO_2$), forsterite ($2MgO.SiO_2$), lead glass ($Na_2O.PbO.SiO_2$), alkali-free glass, and synthetic quartz glass can be exemplified. The length of 0.05 mm to 1.8 mm can be exemplified as the thickness of the substrate.

In the third aspect of the present disclosure, in some cases, the inclined surface which is inclined toward the through-hole may be formed in the part of the substrate positioned below the first land part. In this case, it is preferable that the thickness of the flat part of the first land part be equal to the thickness of the inclined part of the first land part.

In the first to third aspects of the present disclosure including the preferred embodiment (may be collectively and simply referred to as "present disclosure" below), the shape of the through-hole is a kind of a cylindrical shape (circular cylinder) having the radius $r_0$. In addition, for example, a circular shape, an elliptical shape, a rectangular shape, a rounded rectangular shape, a polygonal shape, and a rounded polygonal shape can be exemplified as external shapes of the first and second land parts. The through-hole is positioned at the center of the land part. In the third aspect of the present disclosure, a member for forming the first and second land parts (corresponding to the first member in the first aspect of the present disclosure) may be extended to an inner wall of the through-hole. However, it is not necessary to communicate the first land part with the second land part.

The first and second component attaching parts are parts where the components are mounted. It is preferable to appropriately determine (design) planar shapes of the first and second component attaching parts according to the shapes of a connection terminal part and a connection part (referred to as "connection terminal part and the like" below) of the component to be mounted. In addition, the number of the first component attaching parts is equal to that of the connection terminal parts of the first component to be mounted, and the number of the second component attaching parts is equal to that of the connection terminal parts of the second component to be mounted. The first and second component attaching parts are normally connected to a peripheral circuit and/or a power supply. The peripheral circuit and the power supply can be a known peripheral circuit and power supply, and it is preferable to select an appropriate peripheral circuit and power supply on the basis of the component to be mounted.

It is preferable to form a solder layer on the part of the first component attaching part where the first component is mounted and the part of the second component attaching part where the second component is mounted. As a planar shape of the solder layer, for example, a shape having a projecting part for extending outward from the center part of the solder layer can be exemplified. In this case, a shape can be exemplified in which the projecting part is arranged to be rotationally symmetrical from the center part at least three times and a front end of the projecting part is arranged on the circumference around the center part and the center part has a circular shape. Note that, in these cases, the solder layer can be surrounded by an insulation film formed of a known solder resist material and an organic insulating material such as polyimide and an insulation film formed of a non-organic insulating material such as silicon oxide and silicon nitride (may be collectively referred to as a "coating layer"). In addition, the solder layer is formed on the component to be mounted, and a solder diffusion prevention layer referred to as a under bump metal layer is formed on the component attaching part, and then the solder layer can be joined to the solder diffusion prevention layer. For example, when ground metal is copper, a nickel layer, a gold layer, a tin layer, a palladium layer, or a laminated structure of these layers (for example, a double layered structure of nickel and gold and triple layered structure of nickel^-gold-palladium) can be used as the under bump metal layer.

In the third aspect of the present disclosure, an angle of 50 to 80 degrees can be exemplified as an inclination angle of the inclined surface inclining toward the through-hole, and a length of 0.005 mm to 0.33 mm can be exemplified as the length of the inclined surface. However, the inclination angle and the length of the inclined surface are not limited to the above values.

For example, the through-hole can be formed on the basis of a boring method by using a drill and on the basis of a boring method by using a laser beam. When roughness is generated on the inner wall of the through-hole due to the boring processing, the inner wall of the through-hole may be smoothed, for example, by performing etching.

Known flux may be used, and a known coating method can be used to coat the flux. The solder layer may be formed by using a known method (for example, solder plating method and solder paste printing method) from a known solder material such as a lead-free solder material, and a method for mounting a component via the solder layer may be a known mounting method. That is, specifically, for example, the component may be mounted by using a solder reflow method. An adhesive tape which can be easily peeled after being bonded may be used as the protection film. At the time of plating and chemical etching processing, a masking tape used to partially protect a base material can be used. In order to improve detachability, for example, an ultraviolet rays peeling tape used to temporarily hold a semiconductor wafer can be used. The protection film can be bonded by using a known method, for example, a method by using a laminator. Note that, similarly to the above description, the solder layer is formed on the component to be mounted, and a solder diffusion prevention layer referred to as a under bump metal layer is formed on the component attaching part, and then the solder layer can be joined to the solder diffusion prevention layer.

The substrate can be a double-sided wiring board in which various circuits are formed on the first and second surfaces and may be a so-called multi-layer wiring board. When the multi-layer wiring board is used as the substrate, it is preferable to provide an interlayer insulation layer between wiring layers. For example, it is preferable to coat the outermost surface of the substrate with the coating layer.

The "volume of the part of the through-hole positioned above the top surface of the filling member on the side of the first land part" in (Requirement-1) indicates, more specifically, for example, the volume of the space surrounded by the first land part of the top surface of the filling member on the side of the first land part and the inner wall of the through-hole (conductive layer) or the volume of the part of the recess in the top surface of the filling member on the side of the first land part. When the single connection terminal part and the like is provided for the first component, the "length" of the first component is the length of the first component along a straight line connecting the single connection terminal part and the like and the center of the first land part. In addition, two connection terminal parts and the like are provided for the first component, the "length" of the first component is the length of the first component along a straight line connecting the two connection terminal parts. In addition, when three or more connection terminal parts and the like are provided for the first component, the "length" of the first component is the length of the first component along the shortest distance between two groups of the connection terminals which are obtained by appropriately dividing the three or more connection terminal parts into two groups.

First Embodiment

A first embodiment relates to a mounting substrate and a manufacturing method for the same according to the first and second aspects of the present disclosure and a component mounting method according to the first and second aspects of the present disclosure. FIG. 1A is a schematic partial sectional diagram of a mounting substrate according to the first embodiment to which the components have been mounted, and FIG. 1B is a schematic partial plan view of the mounting substrate after a part of a through-hole has been filled with a filling member.

The mounting substrate according to the first embodiment includes a through-hole 13 formed in a substrate 10, a first land part 21 which is formed on a first surface 11 of the substrate 10 and surrounds the through-hole 13, a second land part 31 which is formed on a second surface 12 of the substrate 10 opposed to the first surface 11 and surrounds the through-hole 13, a first component attaching part 22 which is formed on the first surface 11 of the substrate 10 and is connected to the first land part 21, a second component attaching part 32 which is formed on the second surface 12 of the substrate 10 and is connected to the second land part 31, a conductive layer 14 which is formed on an inner wall of the through-hole 13 and communicates the first land part 21 with the second land part 31, and a filling member 15 which is filled in a part of the through-hole 13.

As expressed in accordance with the mounting substrate according to the first aspect of the present disclosure, the mounting substrate according to the first embodiment includes the following (Requirement-1), and in addition, a shortest distance allowable value $L_0$ is determined so as to satisfy the formula (1) in (Requirement-1). In addition, as expressed in accordance with the mounting substrate according to the second aspect of the present disclosure, in the mounting substrate according to the first embodiment, the first surface of the substrate 10 is coated with flux 40 having an average thickness d, and the shortest distance allowable value $L_0$ is determined so as to satisfy the formula (2) in (Requirement-2).

(Requirement-1)

The shortest distance allowable value $L_0$ from the center of the first land part 21 to the component is determined on the basis of the volume $V_h$ of a part of the through-hole 13 positioned above a top surface of the filling member 15 on the side of the first land part 21 (a part of a recess in the top surface of the filling member 15 on the side of the first land part 21), the length $L_1$ of the component (first component) 51 to be mounted to the first component attaching parts 22 and 23, and the inclination of the component (first component) 51 to be attached to the first component attaching parts 22 and 23 relative to the first surface 11 of the substrate 10 (specifically, for example, on the basis of the maximum allowable value $\theta_{max}$ of the inclination), and in addition, in some cases, on the basis of the thickness of the flux 40 (specifically, for example, the average thickness of the flux 40).

$$\pi \cdot L_1 \cdot \sin(\theta_{max})(L_1^2/3 + L_1 \cdot L_0 + L_0^2) > V_h \qquad (1)$$

(Requirement-2)

When it is assumed that the volume of the part of the through-hole 13 positioned above the top surface of the filling member 15 on the side of the first land part 21 be $V_h$, and the shortest distance allowable value from the center of the first land part 21 to the component be $L_0$, $$\pi \cdot d \cdot L_0^2 > V_h \qquad (2)$$

Note that, in the first or second embodiment, a pair of first component attaching parts and a pair of second component attaching parts are provided, and they are referred to as first component attaching parts 22 and 23 and second component attaching parts 32 and 33. The first component attaching part 23 and the second component attaching part 33 are, for example, connected to the peripheral circuit and/or the power supply.

Here, the volume $V_h$ of the part of the through-hole 13 positioned above the top surface of the filling member 15 on the side of the first land part 21 or the part of the recess in the top surface of the filling member 15 on the side of the first land part 21 (referred to as a "space 13'" for convenience below) can be obtained by experimentally producing a number of mounting substrates and measuring the volumes $V_h$ of the spaces 13' of the through-holes 13. In addition, the radius $r_0$ of the through-hole 13, the length $L_1$ of the first component 51 to be mounted to the first component attaching parts 22 and 23, and the thickness of the flux 40 (specifically, for example, the average thickness of the flux 40) are design factors to be determined on the basis of the specification required for the mounting substrate. In addition, the inclination of the component (first component) 51 to be mounted to the first component attaching parts 22 and 23 (for example, the maximum allowable value $\theta_{max}$ of the inclination) relative to the first surface 11 of substrate 10 is a design factor to be determined on the basis of the specification required for the mounting substrate. In the first or second embodiment, the first component 51 is formed of the light emitting element, specifically, for example, a minute light emitting diode (LED) having the size equal to or less than 0.1 mm. However, when the minute first component 51 is tilted before being mounted, there is a case where the specification cannot be satisfied because the luminance of the light emitting element when the mounting substrate is seen is decreased. The inclination of the first component 51 before being mounted (specifically, for example, the maximum allowable value of the inclination) is, for example, 30 degrees. Therefore, for example, specifically, the angle of 30 degrees can be exemplified as the maximum allowable value $\theta_{max}$.

Figure 17:
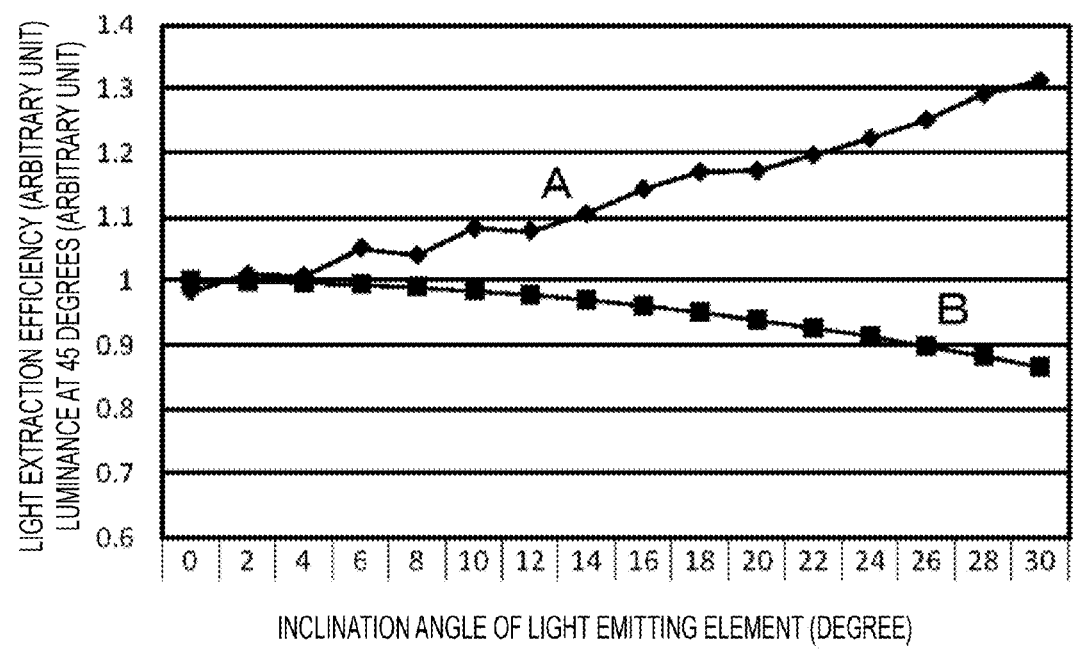
FIG. 17 is a graph of the result of investigation on the relation between the luminance and the light extraction efficiency of the light emitting element when the mounting substrate is seen with a slant angle of 45 degrees relative to the mounting substrate and the inclination of the light emitting element.

That is, the result of investigation on the relation between the luminance and the light extraction efficiency of the light emitting element when the mounting substrate is seen with a slant angle of 45 degrees relative to the mounting substrate and the inclination of the light emitting element is illustrated in FIG. 17. The horizontal axis in FIG. 17 indicates an inclination angle of the light emitting element, and the vertical axis indicates the luminance (refer to "A" in FIG. 17) at 45 degrees and the light extraction efficiency (refer to "B" in FIG. 17). In FIG. 17, when the inclination of the light emitting element reaches 30 degrees, the luminance is changed about 30% in comparison with the luminance at the time when the inclination of the light emitting element is zero degree. Therefore, the maximum allowable value $\theta_{max}$ is assumed to be, specifically, for example, 30 degrees.

In the first or second embodiment, the image display apparatus is configured by arranging the first components 51 formed of the plurality of light emitting elements on the substrate 10 in a two-dimensional matrix.

In addition, in the first or second embodiment, the second component to be mounted (or mounted) to the second component attaching parts 32 and 33 is, for example, formed of an electronic device including a circuit for driving and controlling the first component 51, specifically, a semiconductor device. The second component is larger than the first component 51, and the second component is temporarily fixed to the second component attaching parts 32 and 33 by using adhesive before mounting. Therefore, a problem in that the second component is inclined hardly occurs. Note that the second component is omitted in the drawings.

In the first embodiment, the first land part 21, the second land part 31, the first component attaching parts 22 and 23, the second component attaching parts 32 and 33, and the conductive layer 14 are formed of the first member made of metal or alloy. The filling member 15 is formed of the second member different from the first member. Specifically, the first member is formed of a film in which copper simple substance, or copper, nickel, titanium, and chrome are laminated. The second member is formed of resin mainly formed of epoxy. In addition, the substrate 10 is formed of a glass substrate, more specifically, a borosilicate alkali-free glass substrate having the thickness of 0.5 mm. Here, when it is assumed that the coefficient of thermal expansion of the substrate 10 be $CTE_0$, the coefficient of thermal expansion of the first member be $CTE_1$, and the coefficient of thermal expansion of the second member be $CTE_2$, $CTE_0 < CTE_1 < CTE_2$ is satisfied. Specifically, $CTE_0 = 3 \times 10^{-6}$/K$CTE_1 = 17 \times 10^{-6}$/K$CTE_2 = 50 \times 10^{-6}$/K. In addition, the electric resistance of the filling member 15 is smaller than that of the conductive layer 14. The conductive layer 14 includes an extending part of the first member configuring the first land part 21 and an extending part of the first member configuring the second land part 31. Note that, in the second embodiment, the first land part 21, the second land part 31, the first component attaching parts 22 and 23, and the second component attaching parts 32 and 33 are formed of the first member made of metal or alloy. A filling member 65 is formed of the second member different from the first member. Here, first and second members are formed of the above materials. In addition, in the second embodiment, the substrate 10 is formed of the glass substrate.

The inclination of the first component 51 is hardly generated when the components are mounted by determining the shortest distance allowable value $L_0$ which satisfies the formula (1) in (Requirement-1). This is described with reference to schematic partial end views of the mounting substrate in FIGS. 6A and 6B and schematic diagrams in FIGS. 7A, 7B, 8, and 9 below.

Figure 7A:
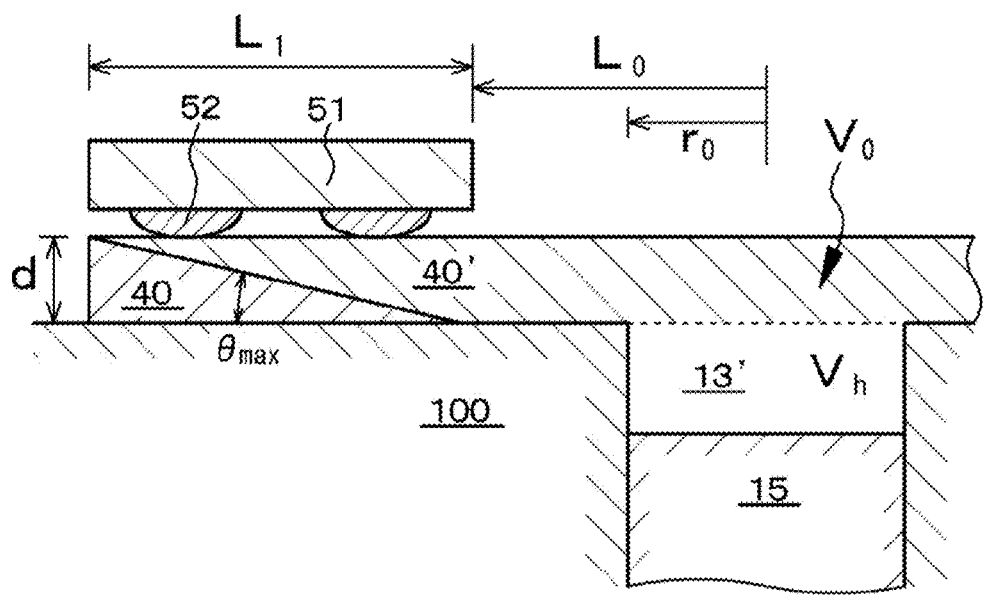
FIGS. 7A and 7B are schematic diagrams of a state where flux coated on a ground is flown into the part (space) of the through-hole positioned above the top surface of the filling member on the side of the first land part.
Figure 7B:
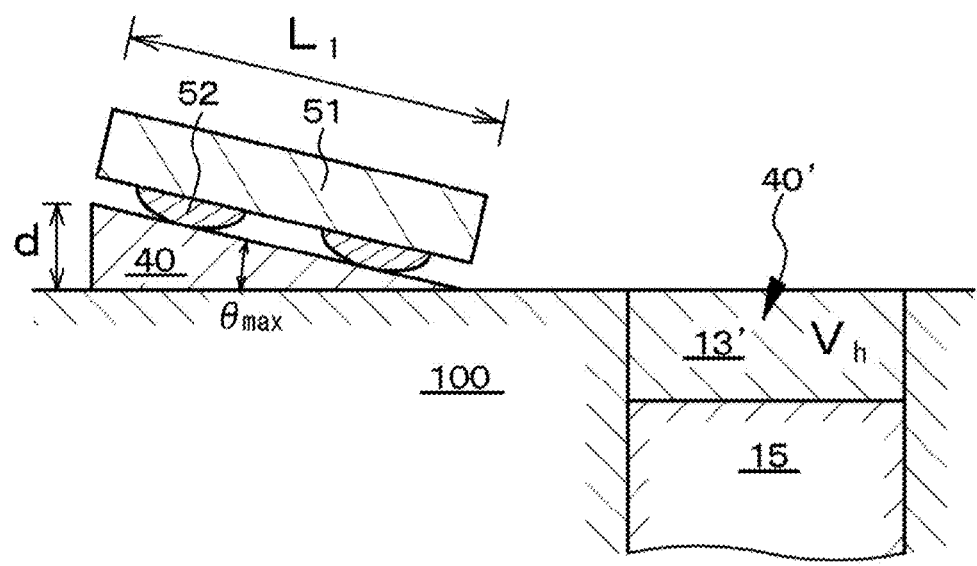
Figure 8:
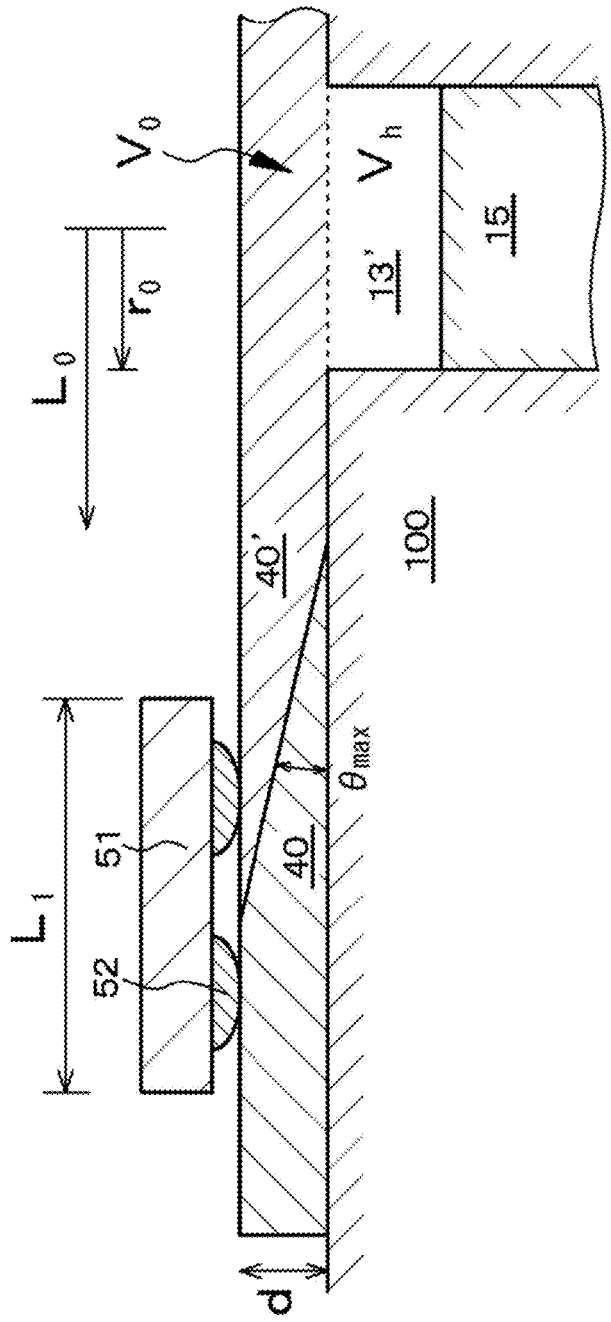
FIG. 8 is a schematic diagram to describe a state where the flux coated on the first surface of the substrate is flown into the part (space) of the through-hole positioned above the top surface of the filling member on the side of the first land part.

In FIG. 6A, a state is illustrated in which the flux 40 is coated on the side of the first surface of the substrate 10 and the first component 51 is provided on the flux 40. In addition, in FIGS. 7A and 8, a state where the flux 40 and 40' are coated on the ground 100 and the first component 51 is provided on the flux 40 and 40'. For example, the ground 100 specifically includes the first component attaching parts 22 and 23, the solder layer 24, the first land part 21, and the first surface 11 of the substrate 10 or includes the solder layer 24, the coating layer 18 (refer to FIG. 15), and the first land part 21. Here, as described above, it is assumed that the volume of the space 13' in the through-hole 13 positioned above the top surface of the filling member 15 on the side of the first land part (not shown in FIGS. 7A, 7B, 8, and 9) be $V_h$. In FIGS. 7A and 8, the flux 40' exists above the space 13'. However, actually, the part of the flux 40' illustrated above the space 13' falls in the space 13' when the flux is coated. In addition, when the first component 51 is mounted to the first component attaching parts 22 and 23, the flux is in a flowing state in accordance with an increase in the temperature of the flux, and an inflow amount to the space 13' is increased. Note that it is assumed that the estimated maximum value of the volume of the flux flowing toward the space 13' be $V_0$. Here, in FIGS. 7A, 8, and 9, the part of the flux is indicated by a reference numeral 40'. As a result of various tests, since the first component 51 is provided on the flux 40 and 40', it is found that about half (½) of the flux in the flowing state immediately below the first component 51 starts to flow toward the space 13' when the first component 51 is arranged at the position closer to the first land part 21 than the shortest distance allowable value $L_0$. In addition, it is found that the state of the flux is concentrically changed to the flowing state around the first land part 21 and the flux in the flowing state starts to flow toward the space 13'. Note that, when the flux is flown out and does not exist anymore, it is difficult to perform soldering with reliability. Therefore, the worst state is considered in which about half (½) of the volume of the flux immediately below the first component 51 flows toward the space 13'.

Figure 9:
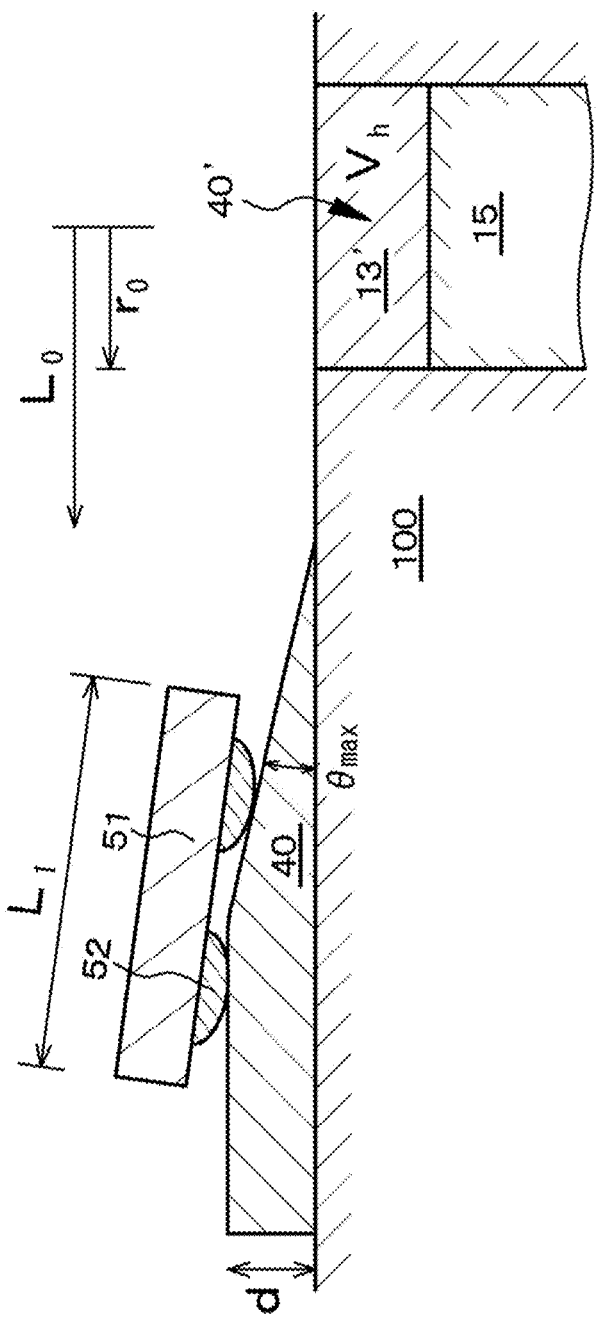
FIG. 9 is continued from FIG. 8 and is a schematic diagram to describe a state where the flux coated on the first surface of the substrate is flown into the part (space) of the through-hole positioned above the top surface of the filling member on the side of the first land part.

Therefore, in consideration of the worst state, an entire shape of the flux 40' flowing toward the space 13' can be approximated by a truncated cone. A state after the flux 40' has started to flow toward the space 13' is illustrated in FIGS. 6B, 7B, and 9. Here, as illustrated in FIG. 7A, the bottom surface of the truncated cone has a circular shape having the radius ($L_0+L_1$), and the top surface has a circular shape having the radius ($L_0$). The height is the thickness d of the flux. Therefore, the value $V_0$ can be obtained by using the following formula.

$$V_0 = (\pi \cdot d/3)\{(L_1 + L_0)^2 + (L_1 + L_0)L_0 + L_0^2\} \quad (3)$$
$$= (\pi \cdot d)(L_1^2/3 + L_1 \cdot L_0 + L_0^2)$$

Further, when it is assumed that the maximum allowable value of the inclination of the first component 51 to be mounted to the first component attaching parts 22 and 23 relative to the first surface 11 of the substrate 10 be $\theta_{max}$, the values d, $L_1$, and $\theta_{max}$ have the following relation.

$$d = L_1 \cdot \sin(\theta_{max}) \quad (4)$$

In addition, it is assumed that the estimated maximum value of the volume of the flux which can flow into the space 13' be $V_0$. However, when the estimated maximum value $V_0$ of the volume is larger than the volume $V_h$ of the space 13', the inclination of the first component 51 to be mounted to the first component attaching parts 22 and 23 relative to the first surface 11 of the substrate 10 can be set within the maximum allowable value $\theta_{max}$. The formula (1) is derived from the requirement and the formulas (3) and (4). That is, the shortest distance allowable value $L_0$ is determined on the basis of (Requirement-1), and in addition, the shortest distance allowable value $L_0$ is determined so as to satisfy the formula (1) in (Requirement-1). Accordingly, a problem in that the flux 40' flows into the recess (space 13') in the top surface of the filling member 15 and the minute first component 51 before mounting is inclined can be surely prevented (refer to FIGS. 1A and 9). Note that, when the shortest distance allowable value $L_0$ does not satisfy the formula (1) in (Requirement-1), as illustrated in FIG. 6B, there is a case where the flux immediately below the connection terminal part and the like 52 provided in the first component 51 is flown out and a problem occurs in the connection between the connection terminal part and the like 52 and the solder layer 24. For example, α=1.2 is assumed as a kind of a safety coefficient α, and the shortest distance allowable value $L_0$ to satisfy the formula (1) in (Requirement-1) is obtained, and the obtained shortest distance allowable value $L_0$ is multiplied by α (specifically, for example, 1.2 times). The obtained value may be used as a new shortest distance allowable value.

In addition, according to the specification regarding the mounting of the first component 51, when the flux occupying a cylinder (volume: $\pi \cdot d \cdot L_0^2$) having the radius $L_0$ and the height d illustrated in FIGS. 7A and 8 does not flow into the space 13', the problem in that the minute first component 51 before mounting is inclined can be surely prevented. In the above requirement, when the volume ($\pi \cdot d \cdot L_0^2$) is larger than the volume $V_h$ of the space 13', a problem in the inclination of the first component 51 to be mounted to the first component attaching parts 22 and 23 relative to the first surface 11 of the substrate 10 does not occur. That is, when the shortest distance allowable value $L_0$ is determined so as to satisfy the formula (2) in (Requirement-2), a problem in that the flux flows into the recess (space 13') in the top surface of the filling member 15 and the minute first component 51 before mounting is inclined can be surely prevented. Note that, when the shortest distance allowable value $L_0$ does not satisfy the formula (2) in (Requirement-2), there is a case where the flux immediately below the connection terminal part and the like 52 provided in the first component 51 and a problem occurs in the connection between the connection terminal part and the like 52 and the solder layer 24. For example, β=1.2 is assumed as a kind of a safety coefficient β, and the shortest distance allowable value $L_0$ to satisfy the formula (2) in (Requirement-2) is obtained, and the obtained shortest distance allowable value $L_0$ is multiplied by β (specifically, for example, 1.2 times). The obtained value may be used as a new shortest distance allowable value.

Amounting substrate manufacturing method and a component mounting method according to the first embodiment are described below with reference to the schematic partial sectional diagrams and the partial end views of the substrates in FIGS. 1A, 2A, 2B, 3A, 3B, 4A, 4B, and 5A and the schematic partial plan view of the substrate and the like in FIG. 1B.

[Process-100]

First, the through-hole 13 is formed in the substrate 10 on the basis of a known method. For example, the through-hole 13 can be formed on the basis of a boring method by using a drill and on the basis of a boring method by using a laser beam. When roughness is generated on the inner wall of the through-hole 13 due to the boring processing, the inner wall of the through-hole 13 may be smoothed, for example, by performing etching.

[Process-110]

Next, the first land part 21 surrounding the through-hole 13, the first component attaching part 22 connected to the first land part 21, and the first component attaching part 23 are formed on the first surface 11 of the substrate 10, and the second land part 31 surrounding the through-hole 13, the second component attaching part 32 connected to the second land part 31, and the second component attaching part 33 are formed on the second surface 12 of the substrate 10 opposed to the first surface 11. The conductive layer 14 for communicating the first land part 21 with the second land part 31 is formed on the inner wall of the through-hole 13. Specifically, for example, the first member is formed by using the sputtering method from the second surface 12 of the substrate 10 to the through-hole 13. Next, the first member is formed by using the sputtering method from the first surface 11 of the substrate 10 to the through-hole 13. Note that the first member may be formed by using the sputtering method from the first surface 11 of the substrate 10 to the through-hole 13, and subsequently, the first member may be formed by using the sputtering method from the second surface 12 of the substrate 10 to the through-hole 13. Accordingly, the conductive layer 14 can be formed on the inner wall of the through-hole 13. Subsequently, on the basis of a known patterning technique, the first component attaching parts 22 and 23, the first land part 21, the second component attaching parts 32 and 33, and the second land part 31 are formed. In this way, the state illustrated in FIG. 2A can be obtained.

[Process-120]

Next, a part of the through-hole 13 is filled with the filling member 15. Specifically, first, a masking tape is bonded to the first surface 11 of the substrate 10 as the protection film 16 by using the laminator (refer to FIG. 2B). The masking tape is formed of a polyethylene terephthalate (PET) film, and an acrylic adhesive layer which can be peeled again is formed on the surface of the masking tape. Then, the through-hole 13 is filled with the filling member 15 from the side of the second surface of the substrate 10 (refer to FIG. 3A). The through-hole 13 can be filled with the filling member 15 on the basis of a printing method (for example, screen printing method) and a method using a dispenser. Subsequently, after the protection film 16 has been peeled (refer to FIG. 3B), the second member configuring the filling member 15 is cured (refer to FIG. 4A). Note that the protection film 16 may be peeled after the second member has been cured. In general, when the second member is cured, the volume of the filling member 15 is contracted. As a result, the space 13' having the volume $V_h$ is generated in the part of the through-hole 13 positioned above the top surface of the filling member 15 on the side of the first land part 21. In addition, a space 13" is generated in a part of the through-hole 13 positioned above the top surface of the filling member 15 on the side of the second land part 31.

[Process-130]

After that, the solder layer 24 is formed on the parts of the first component attaching parts 22 and 23 where the first component 51 is mounted. The solder layer 34 is also formed on the parts of the second component attaching parts 32 and 33 where the second component is mounted. The solder layers 24 and 34 may be formed on the basis of a known method (for example, solder plating method and solder paste printing method) from a known soldering material such as a lead-free solder material. FIG. 1B is a partial plan view of this state looked from the side of the first surface of the substrate 10. The coating layer may be formed before the solder layer is formed.

[Process-140]

Subsequently, the flux 40 having the average thickness d is coated on the side of the first surface of the substrate 10 (refer to FIG. 4B). Known flux 40 may be used as the flux 40, and a known coating method can be used to coat the flux 40. The flux is also coated on the side of the second surface of the substrate 10. However, in the drawings, the flux coated on the side of the second surface of the substrate 10 is omitted.

[Process-150]

After that, the first component 51 is placed on the parts of the first component attaching parts 22 and 23 where the first component 51 is mounted on the basis of a known method (refer to FIG. 5A). Before that, the second component (not shown) is temporarily fixed to the second component attaching parts 32 and 33 with the adhesive. Subsequently, for example, the first component 51 is mounted on the parts of the first component attaching parts 22 and 23 where the first component 51 is mounted on the basis of the solder reflow method via the solder layers 24 and 34, and the second component is mounted on the parts of the second component attaching parts 32 and 33 where the second component is mounted. In this way, the mounting substrate (mounting substrate to which the components are mounted) according to the first embodiment illustrated in FIG. 1A can be obtained. As illustrated in FIG. 1A, a part of the flux 40 flows into the space 13'. However, the flux 40 remains under the first component 51, and the first component 51 is not inclined.

As described above, in the first embodiment, the shortest distance allowable value $L_0$ is determined on the basis of (Requirement-1), and in addition, the shortest distance allowable value $L_0$ is determined so as to satisfy the formula (1) in (Requirement-1) or the shortest distance allowable value $L_0$ is determined so as to satisfy the formula (2) in (Requirement-2). Therefore, when a part of the through-hole is filled with the filling member, the volume of the filling member is contracted, and a space (recess) is generated in the top surface of the filling member filled in the through-hole. Even in the above state, when the flux is coated on the entire surface and the minute first component is mounted via the solder layer, a problem in that the flux flows into the space (recess) in the top surface of the filling member and the minute component before mounting is inclined can be surely prevented.

Note that, similarly to the second embodiment described below, in the first embodiment, as illustrated in the schematic partial end view in FIG. 5B, when the through-hole 13 is formed, an inclined surface 17 which is inclined toward the through-hole 13 may be formed in a part 10' of the substrate 10 where the second land part 31 is formed. Note that a reference numeral 17' indicates a flat part in the part 10' of the substrate 10 where the second land part 31 is formed. In this case, it is preferable that the thickness of the flat part of the second land part 31 be equal to that of the inclined part of the second land part 31.

Second Embodiment

Figure 10:
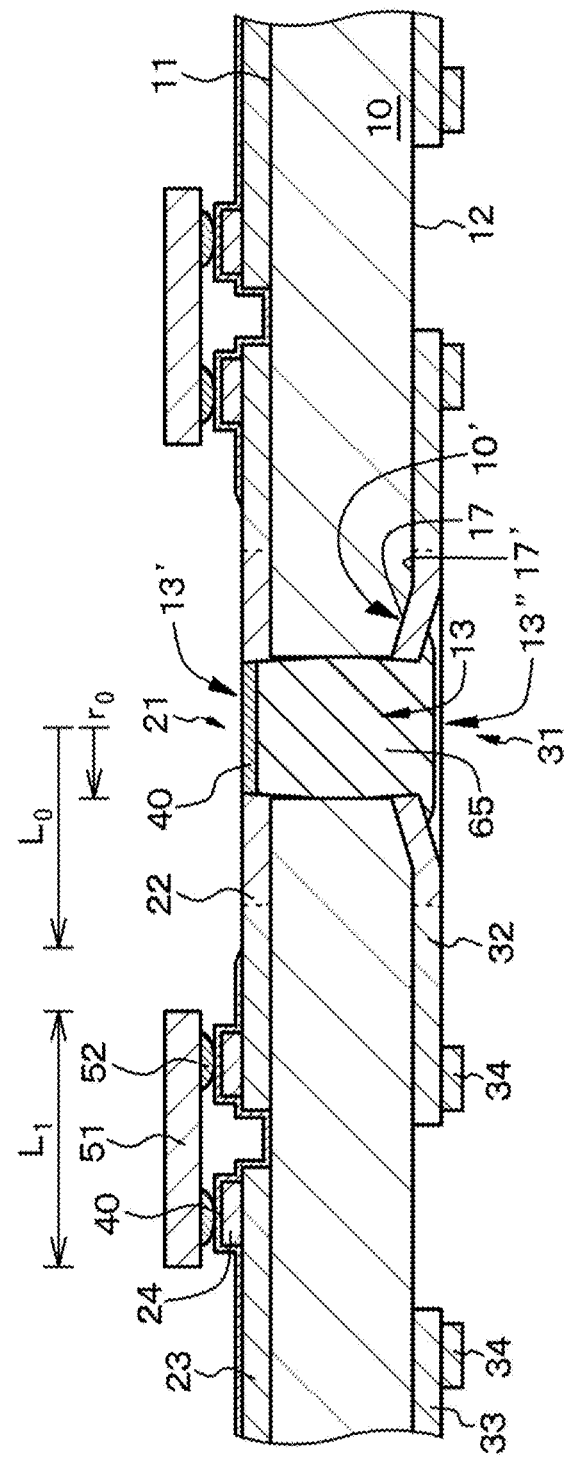
FIG. 10 is a schematic partial sectional diagram of a mounting substrate according to a second embodiment after components are mounted.
Figure 12A:
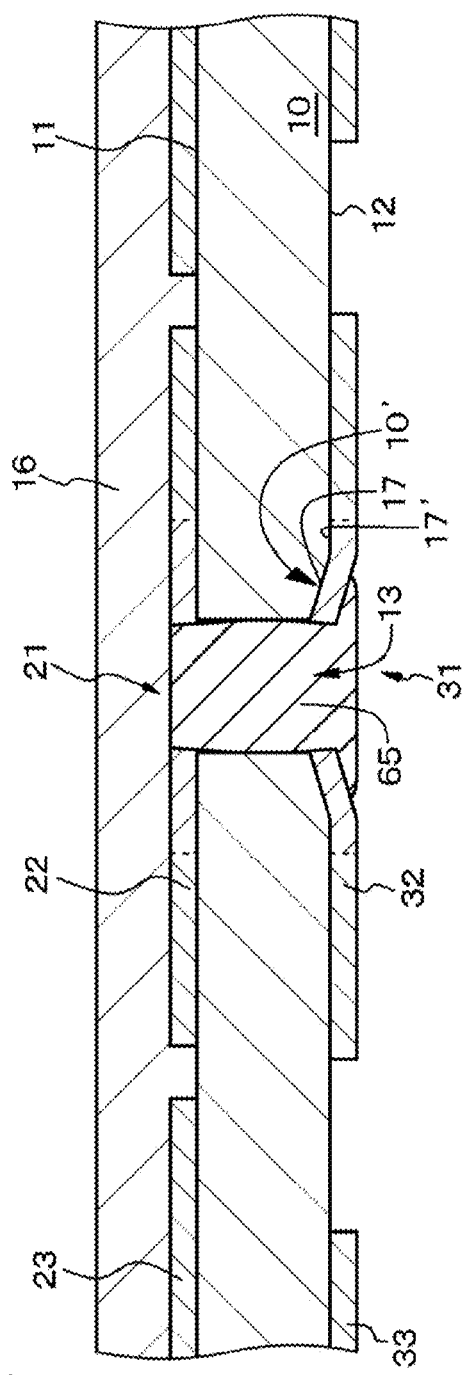
FIGS. 12A and 12B are schematic partial end views of the mounting substrate according to the second embodiment after the through-hole has been filled with the filling member.
Figure 12B:
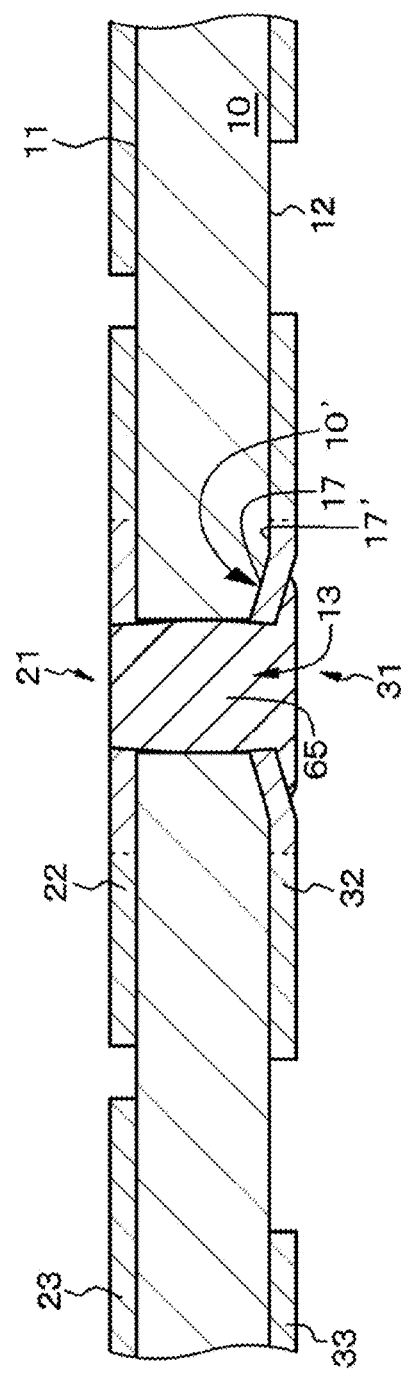

The second embodiment relates to a mounting substrate according to a third aspect of the present disclosure and a manufacturing method for the same. FIG. 10 is a schematic partial sectional diagram of a mounting substrate according to the second embodiment after the components have been mounted.

The mounting substrate according to the second embodiment includes a through-hole 13 formed in a substrate 10, a first land part 21 which is formed on a first surface 11 of the substrate 10 and surrounds the through-hole 13, a second land part 31 which is formed on a second surface 12 of the substrate 10 opposed to the first surface 11 and surrounds the through-hole 13, a first component attaching part 22 which is formed on the first surface 11 of the substrate 10 and is connected to the first land part 21, a second component attaching part 32 which is formed on the second surface 12 of the substrate 10 and is connected to the second land part 31, and a filling member 65 which is formed of a conductive material and is filled into the through-hole 13 and communicates the first land part 21 with the second land part 31. An inclined surface 17 which is inclined toward the through-hole 13 is formed in a part 10' of the substrate 10 positioned below the second land part 31.

In addition, in the second embodiment, the thickness of a flat part of the second land part 31 is equal to that of an inclined part of the second land part 31. An angle of 50 degrees can be exemplified as an inclination angle of the inclined surface 17 which is inclined toward the through-hole 13, and a length of 0.33 mm can be exemplified as the length of the inclined surface 17.

In the mounting substrate according to the second embodiment illustrated in FIG. 10, the structure of the first surface described in the first embodiment is employed as the structure of the first surface. That is, also in the second embodiment, a shortest distance allowable value $L_0$ is determined on the basis of the (Requirement-1) on the side of the first surface of the substrate, and in addition, the shortest distance allowable value $L_0$ is determined so as to satisfy the formula (1) in (Requirement-1).

A mounting substrate manufacturing method and a component mounting method according to the first embodiment are described below with reference to the schematic partial sectional diagrams and the partial end views of the substrate and the like in FIGS. 10, 11A, 11B, 12A, 12B, 13A, 13B, and 14.

[Process-200]

First, similarly to [Process-100] in the first embodiment, the through-hole 13 is formed in the substrate 10 on the basis of a known method.

[Process-210]

The inclined surface 17 which is inclined toward the through-hole 13 is formed in the part 10' of the substrate 10 where the second land part 31 is mounted. That is, after the through-hole 13 has been formed, for example, a mask for etching (not shown) is formed, and the etching is performed to the substrate 10 by using hydrofluoric acid. By removing the mask for etching after that, the inclined surface 17 which is inclined toward the through-hole 13 can be formed in the part 10' of the substrate 10 where the second land part 31 is formed. Note that a flat part 17' is also provided in the part 10' of the substrate 10 where the second land part 31 is formed.

[Process-220]

Next, the first land part 21 surrounding the through-hole 13, the first component attaching parts 22 connected to the first land part 21, and the first component attaching part 23 are formed on the first surface 11 of the substrate 10, and the second land part 31 surrounding the through-hole 13, the second component attaching part 32 connected to the second land part 31, and the second component attaching part 33 are formed on the second surface 12 of the substrate 10 opposed to the first surface 11. Specifically, for example, a first member is formed on the second surface 12 of the substrate 10 by using the sputtering method, and subsequently, a first member is formed on the first surface 11 of the substrate 10 by using the sputtering method. Note that it is possible to form the first member may on the first surface 11 of the substrate 10 by using the sputtering method and subsequently form the first member on the second surface 12 of the substrate 10 by using the sputtering method. In the second embodiment, it is not necessary to form a conductive layer described in FIG. 1A on an inner wall of the through-hole 13. Subsequently, on the basis of a known patterning technique, the first component attaching parts 22 and 23, the first land part 21, the second component attaching parts 32 and 33, and the second land part 31 are formed. In this way, the state illustrated in FIG. 11A can be obtained.

[Process-230]

Subsequently, the through-hole 13 is filled with the filling member 65 formed of a conductive material, and accordingly, the first land part 21 is communicated with the second land part 31. Specifically, first, similarly to the first embodiment, a protection film 16 is bonded to the first surface 11 of the substrate 10 by using a laminator (refer to FIG. 11B). Then, the through-hole 13 is filled with the filling member 65 from the side of the second surface of the substrate 10 (refer to FIG. 12A). The through-hole 13 can be filled with the filling member 65 on the basis of a printing method (for example, screen printing method) and a method using a dispenser. Subsequently, after the protection film 16 has been peeled (refer to FIG. 12B), the second member configuring the filling member 65 is cured (refer to FIG. 13A). The protection film 16 may be peeled after the second member has been cured. In general, when the second member is cured, the volume of the filling member 65 is contracted. As a result, the space 13' having the volume $V_h$ is generated in the part of the through-hole 13 positioned above the top surface of the filling member 65 on the side of the first land part 21. In addition, a space 13" is generated in a part of the through-hole 13 positioned above the top surface of the filling member 65 on the side of the second land part 31. The filling member 65 is extended on the second land part 31. However, the top surface of the filling member 65 is not projected from the level of the top surface of the second component attaching part 32.

[Process-240]

After that, similarly to [Process-130] in the first embodiment, the solder layer 24 is formed on the parts of the first component attaching parts 22 and 23 where the first component 51 is mounted. The solder layer 34 is also formed on the parts of the second component attaching parts 32 and 33 where the second component is mounted.

[Process-250]

Subsequently, similarly to [Process-140] in the first embodiment, the flux 40 having the average thickness d is coated on the side of the first surface of the substrate 10

(refer to FIG. 13B). Note that the flux is also coated on the side of the second surface of the substrate 10. However, in the drawings, the flux coated on the side of the second surface of the substrate 10 is omitted.

[Process-260]

Figure 14:
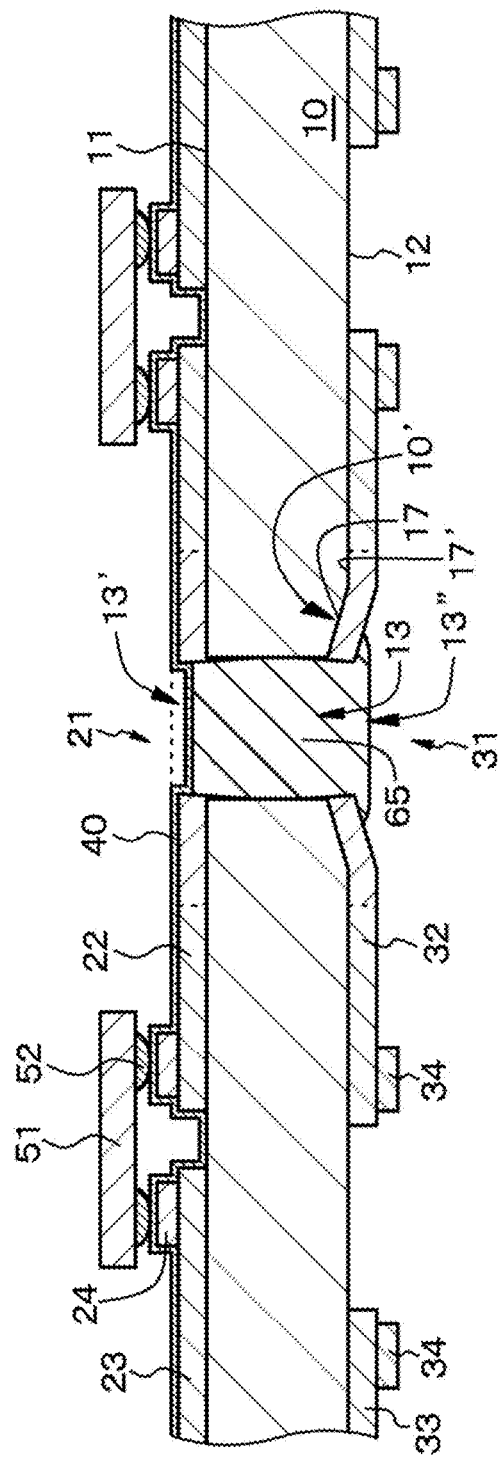
FIG. 14 is a schematic partial end view of the mounting substrate according to the second embodiment in a state where a first component is attached on a first component attaching part.

After that, similarly to [Process-150] in the first embodiment, the first component 51 is placed in the parts of the first component attaching parts 22 and 23 where the first component 51 is mounted on the basis of a known method (refer to FIG. 14). Before that, the second component (not shown) is temporarily fixed to the second component attaching parts 32 and 33 with the adhesive. Subsequently, for example, the first component 51 is mounted on the parts of the first component attaching parts 22 and 23 where the first component 51 is mounted on the basis of the solder reflow method via the solder layers 24 and 34, and the second component is mounted on the parts of the second component attaching parts 32 and 33 where the second component is mounted. In this way, the mounting substrate (mounting substrate to which the components are mounted) according to the second embodiment illustrated in FIG. 10 can be obtained.

As described above, in the second embodiment, since the inclined surface which is inclined toward the through-hole is formed in the part of the substrate positioned below the second land part, the filling member can be extended on the second land part, and reliability of the electrical connection between the filling member and the second land part can be improved. In addition, since it is not necessary to largely projecting the filling member on the land part, that is, the top surface of the filling member is not projected from the level of the top surface of the second component attaching part although the filling member is extended to the second land part, it is not necessary to polish and remove the filling member. A problem in that the substrate is damaged does not occur.

In the second embodiment, in some cases, a form can be employed in which the inclined surface inclining toward the through-hole 13 is formed in the part of the substrate 10 positioned below the first land part 21. In this case, it is preferable that the thickness of the flat part of the first land part 21 be equal to that of the inclined part of the first land part 21.

The preferred embodiments of the present disclosure have been described above. However, the present disclosure is not limited to the embodiments. The structure, the configuration, and the used materials of the mounting substrate described in the embodiments are only exemplary and can be appropriately changed. The first component is configured of the light emitting element in the embodiments. However, the first component is configured of, for example, a sensor for detecting visible light, a sensor for detecting infrared rays, a sensor for detecting ultraviolet rays, a sensor for detecting X-rays, a sensor for detecting atmospheric pressure, a sensor for detecting a temperature, a sensor for detecting sound, a sensor for detecting vibration, a sensor for detecting acceleration, and a sensor for detecting angular acceleration and a plurality of sensors is arranged on the substrate so that a sensor array can be formed. The first component can be a composite component of the light emitting element, the sensor, and a third component. Multi-layer wiring can be provided on the second surface of the substrate.

As illustrated in the schematic partial end view of a state where the flux is coated on the side of the first surface of the substrate in FIG. 15A and illustrated in the schematic partial end view of the state after the components have been mounted in FIG. 15B, in a mounting substrate according to another modification of the first embodiment after the components have been mounted, the solder layer 24 can be surrounded by the coating layer 18 such as an insulation film formed of a known solder resist material and an organic insulating material such as polyimide and an insulation film formed of a non-organic insulating material such as silicon oxide and silicon nitride. Specifically, it is preferable that the coating layer 18 having openings in a part where the solder layer 24 is formed and the land part 21 be formed on the first surface 11 of the substrate 10, and after that, the solder layer 24 be formed on the opening part where the solder layer 24 is formed. After that, the flux 40 is coated on the solder layer 24, the coating layer 18, and the first land part 21 (refer to FIG. 15A). Then, the first component 51 is mounted to the parts of the first component attaching parts 22 and 23 where the first component 51 is mounted, for example, on the basis of the solder reflow method via the solder layers 24 and 34, and the second component (hot shown) is mounted in the parts of the second component attaching parts 32 and 33 where the second component is mounted. Accordingly, the state illustrated in FIG. 15B can be obtained.

Figure 16:
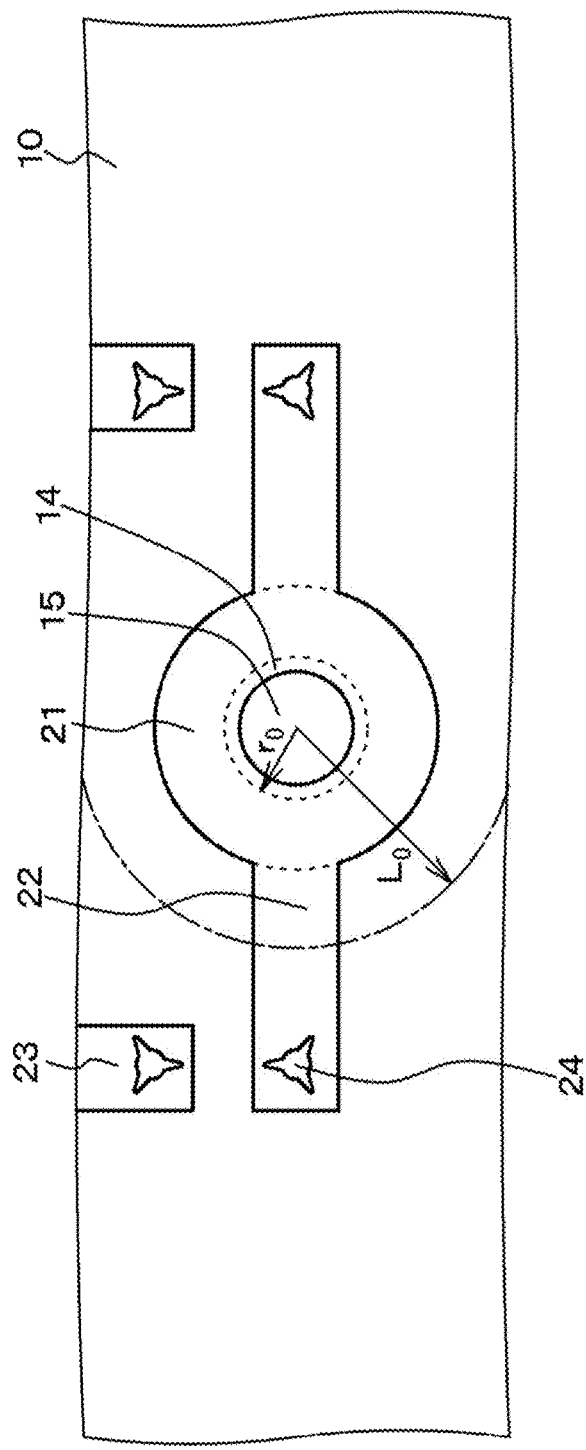
FIG. 16 is a schematic partial plan view of still another modification of the mounting substrate according to the first embodiment after a part of the through-hole is filled with the filling member.

In addition, when the solder layer 24 is formed, the technique disclosed in Japanese Patent Application Laid-Open No. 2010-123780 can be applied. That is, as illustrated in FIGS. 1B and 16, the planar shape of the solder layer 24 can be a shape having a projecting part extending outward from the center part of the solder layer 24. Further, in this case, a shape of the projecting part can be arranged to be rotationally symmetrical from the center part at least three times and a front end of the projecting part can be arranged on the circumference around the center part and the center part has a circular shape. In addition, it is possible to form the solder layer on the side of the component to be mounted, form the solder diffusion prevention layer on the component attaching part, and bond the solder layer to the solder diffusion prevention layer.

In addition, the first component attaching parts 22 and 23 which extend straight from the first land part 21 are illustrated in FIG. 1B. However, as illustrated in the schematic partial plan view of still another modification of the mounting substrate according to the first embodiment after a part of the through-hole 13 has been filled with the filling member 15 in FIG. 16, the first component attaching parts 22 and 23 can extend in a direction different from the direction extending straight from the first land part 21 (in the example in FIG. 16, direction bent at 90°).

Note that the present disclosure may have a configuration as follows.

[A01] <<Mounting substrate: First aspect>>

A mounting substrate including:

a through-hole configured to be formed in a substrate;

a first land part configured to be formed on a first surface of the substrate and surround the through-hole;

a second land part configured to be formed on a second surface of the substrate opposed to the first surface and surround the through-hole;

a first component attaching part configured to be formed on the first surface of the substrate and be connected to the first land part;

a second component attaching part configured to be formed on the second surface of the substrate and be connected to the second land part;

a conductive layer configured to be formed on an inner wall of the through-hole and communicate the first land part with the second land part; and a filling member configured to be filled into a part of the through-hole, wherein a shortest distance allowable value from the center of the first land part to a component is determined on the basis of a volume of a part of the through-hole positioned above a top surface of the filling member on the side of the first land part, a length of a component to be mounted to the first component attaching part, and an inclination of the component to be mounted to the first component attaching part relative to the first surface of the substrate (specifically, on the basis of the maximum allowable value of the inclination).

[A02] The mounting substrate according to [A01], wherein
when it is assumed that the volume of the part of the through-hole positioned above a top surface of the filling member on the side of the first land part be $V_h$, that the length of the component to be mounted to the first component attaching part be $L_1$, that the maximum allowable value of the inclination of the component to be mounted to the first component attaching part relative to the first surface of the substrate be $\theta_{max}$, and that the shortest distance allowable value from the center of the first land part to the component be $L_0$, the shortest distance allowable value $L_0$ is determined so as to satisfy the following formula (1).

$$\pi \cdot L_1 \cdot \sin(\theta_{max})(L_1^2/3 + L_1 \cdot L_0 + L_0^2) > V_h \quad (1)$$

[A03] The mounting substrate according to [A02], wherein
the value of $\theta_{max}$ is 30 degrees.

[A04] <<Mounting substrate: Second aspect>>
A mounting substrate including:
a through-hole configured to be formed in a substrate;
a first land part configured to be formed of a first surface of the substrate and surround the through-hole;
a second land part configured to be formed on a second surface of the substrate opposed to the first surface and surround the through-hole;
a first component attaching part configured to be formed on the first surface of the substrate and be connected to the first land part;
a second component attaching part configured to be formed on the second surface of the substrate and be connected to the second land part;
a conductive layer configured to be formed on an inner wall of the through-hole and communicate the first land part with the second land part; and
a filling member configured to be filled into a part of the through-hole, wherein
flux having an average thickness d is coated on a side of the first surface of the substrate, and
when it is assumed that the volume of the part of the through-hole positioned above a top surface of the filling member on the side of the first land part be $V_h$ and that a shortest distance allowable value from the center of the first land part to a component be $L_0$, the shortest distance allowable value $L_0$ is determined so as to satisfy the following formula (2).

$$\pi \cdot d \cdot L_0^2 > V_h \quad (2)$$

[A05] The mounting substrate according to any one of [A01] to [A04], wherein
the first land part, the second land part, the first component attaching part, the second component attaching part, and the conductive layer are formed of a first member formed of metal or alloy, and
the filling member is formed of a second member different from the first member.

[A06] The mounting substrate according to [A05], wherein
when it is assumed that a coefficient of thermal expansion of the substrate be $CTE_0$, that a coefficient of thermal expansion of the first member be $CTE_1$, and that a coefficient of thermal expansion of the second member be $CTE_2$, $CTE_2 - CTE_0 < CTE_1 - CTE_0$ or $CTE_0 < CTE_1 < CTE_2$ is satisfied.

[A07] The mounting substrate according to [A05], wherein
the first member is formed of at least one kind of material selected from a group including aluminum, aluminum alloy, nickel, nickel alloy, chrome, and chromium alloy, and the second member is formed of conductive paste.

[A08] The mounting substrate according to any one of [A01] to [A07], wherein
an inclined surface which is inclined toward the through-hole is formed in a part of the substrate positioned below the second land part.

[A09] The mounting substrate according to [A08], wherein
a thickness of a flat part of the second land part is equal to that of an inclined part of the second land part.

[B01] <<Mounting substrate: Third aspect>>
A mounting substrate including:
a through-hole configured to be formed in a substrate;
a first land part configured to be formed on a first surface of the substrate and surround the through-hole;
a second land part configured to be formed on a second surface of the substrate opposed to the first surface and surround the through-hole;
a first component attaching part configured to be formed on the first surface of the substrate and be connected to the first land part;
a second component attaching part configured to be formed on the second surface of the substrate and be connected to the second land part; and
a filling member configured to be formed of a conductive material and be filled into the through-hole and communicate the first land part with the second land part, wherein
an inclined surface which is inclined toward the through-hole is formed in a part of the substrate positioned below the second land part.

[B02] The mounting substrate according to [B01], wherein
a thickness of a flat part of the second land part is equal to that of an inclined part of the second land part.

[B03] The mounting substrate according to [B01] or [B02], wherein
when it is assumed that the volume of the part of the through-hole positioned above a top surface of the filling member on the side of the first land part be $V_h$, that the length of a component to be mounted to the first component attaching part be $L_1$, that the maximum allowable value of the inclination of the component to be mounted to the first component attaching part relative to the first surface of the substrate be $\theta_{max}$, and that the shortest distance allowable value from the center of the first land part to the component be $L_0$, the shortest distance allowable value $L_0$ is determined so as to satisfy the following formula (1).

$$\pi \cdot L_1 \cdot \sin(\theta_{max})(L_1^2/3 + L_1 \cdot L_0 + L_0^2) > V_h \quad (1)$$

[B04] The mounting substrate according to any one of [B01] to [B03], wherein
an inclination angle of the inclined surface inclined toward the through-hole is of 50 to 80 degrees.

[B05] The mounting substrate according to [B01] or [B02], wherein
the inclined surface which is inclined toward the through-hole is formed in a part of the substrate positioned below the first land part.

[B06] The mounting substrate according to [B05], wherein
a thickness of a flat part of the first land part is equal to that of an inclined part of the first land part.

[B07] The mounting substrate according to any one of [B01] to [B06], wherein
the filling member is extended on the second land part.

[B08] The mounting substrate according to [B07], wherein
the top surface of the filling member is not projected from the level of a top surface of the second component attaching part.

[C01] The mounting substrate according to any one of [A01] to [B08], wherein
the component to be mounted to the first component attaching part is formed of a light emitting element.

[C02] The mounting substrate according to [C01], wherein
a plurality of light emitting elements is arranged in a two-dimensional matrix and forms an image display apparatus.

[C03] The mounting substrate according to any one of [A01] to [B08], wherein
the component to be mounted to the first component attaching part is formed of a sensor.

[C04] The mounting substrate according to any one of [A01] to [C03], wherein
the substrate is formed of a glass substrate.

[D01] <<Mounting substrate manufacturing method: First aspect>>
A mounting substrate manufacturing method including:
forming a first land part, which surrounds a through-hole, on a first surface of a substrate and a first component attaching part connected to the first land part after the through-hole has been formed in the substrate and forming a second land part, which surrounds the through-hole, on a second surface of the substrate opposed to the first surface and a second component attaching part connected to the second land part and forming a conductive layer, which communicates the first land part with the second land part, on an inner wall of the through-hole; and subsequently
filling a filling member into a part of the through-hole, wherein
a shortest distance allowable value from the center of the first land part to a component is determined on the basis of a volume of a part of the through-hole positioned above a top surface of the filling member on the side of the first land part, a length of a component to be mounted to the first component attaching part, and an inclination of the component to be mounted to the first component attaching part relative to the first surface of the substrate (specifically, for example, on the basis of the maximum allowable value of the inclination).

[D02] The mounting substrate manufacturing method according to [D01], wherein
when it is assumed that the volume of the part of the through-hole positioned above a top surface of the filling member on the side of the first land part be $V_h$, that the length of a component to be mounted to the first component attaching part be $L_1$, that the maximum allowable value of the inclination of the component to be mounted to the first component attaching part relative to the first surface of the substrate be $\theta_{max}$, and that the shortest distance allowable value from the center of the first land part to the component be $L_0$, the shortest distance allowable value $L_0$ is determined so as to satisfy the following formula (1).

$$\pi \cdot L_1 \cdot \sin(\theta_{max})(L_1^2/3 + L_1 \cdot L_0 + L_0^2) > V_h \quad (1)$$

[D03] The mounting substrate manufacturing method according to [D02], wherein
the value of $\theta_{max}$ is 30 degrees.

[D04] <<Mounting substrate manufacturing method: Second aspect>>
A mounting substrate manufacturing method including:
forming a first land part, which surrounds a through-hole, on a first surface of a substrate and a first component attaching part connected to the first land part after the through-hole has been formed in the substrate and forming a second land part, which surrounds the through-hole, on a second surface of the substrate opposed to the first surface and a second component attaching part connected to the second land part and forming a conductive layer, which communicates the first land part with the second land part, on an inner wall of the through-hole; subsequently
filling a filling member into a part of the through-hole, and
coating flux having an average thickness d on a side of the first surface of the substrate after a part of the through-hole has been filled with the filling member, wherein
a shortest distance allowable value $L_0$ is determined so as to satisfy the following formula (2) when it is assumed that a volume of a part of the through-hole positioned above a top surface of the filling member on the side of the first land part be $V_h$ and that a shortest distance allowable value from the center of the first land part to the component be $L_0$.

$$\pi \cdot d \cdot L_0^2 > V_h \quad (2)$$

[D05] The mounting substrate manufacturing method according to any one of [D01] to [D04], wherein
the first land part, the second land part, the first component attaching part, the second component attaching part, and the conductive layer are formed of a first member formed of metal or alloy, and
the filling member is formed of a second member different from the first member.

[D06] The mounting substrate manufacturing method according to [D05], wherein
when it is assumed that a coefficient of thermal expansion of the substrate be $CTE_0$, that a coefficient of thermal expansion of the first member be $CTE_1$, and that a coefficient of thermal expansion of the second member be $CTE_2$, $CTE_2 - CTE_0 < CTE_1 - CTE_0$ or $CTE_0 < CTE_1 < CTE_2$ is satisfied.

[D07] The mounting substrate manufacturing method according to [D05], wherein
the first member is formed of at least one kind of material selected from a group including aluminum, aluminum alloy, nickel, nickel alloy, chrome, and chromium alloy, and
the second member is formed of conductive paste.

[D08] The mounting substrate manufacturing method according to any one of [D01] to [D07], wherein
the first component attaching part, the first land part, the second component attaching part, the second land part, and the conductive layer are formed on the basis of a combination of physical vapor deposition and an etching technique, and
the through-hole is filled with the filling member on the basis of a printing method.

[D09] The mounting substrate manufacturing method according to any one of [D01] to [D08], wherein
the through-hole is filled with the filling member in a state where a protection film is bonded to the first surface of the substrate.

[D10] The mounting substrate manufacturing method according to any one of [D01] to [D09], wherein
an inclined surface which is inclined toward the through-hole is formed in a part of the substrate where the second land part is formed when the through-hole is formed.

[D11] The mounting substrate manufacturing method according to [D10], wherein
a thickness of a flat part of the second land part is equal to that of an inclined part of the second land part.

[E01] <<Mounting substrate manufacturing method: Third aspect>>
A mounting substrate manufacturing method including:
forming a first land part, which surrounds a through-hole, on a first surface of a substrate and a first component attaching part connected to the first land part after the through-hole has been formed in the substrate and forming a second land part, which surrounds the through-hole, on a second surface of the substrate opposed to the first surface and a second component attaching part connected to the second land part; and subsequently
communicating the first land part with the second land part by subsequently filling the through-hole with a filling member formed of a conductive material, wherein
an inclined surface which is inclined toward the through-hole is formed in apart of the substrate where the second land part is formed.

[E02] The mounting substrate manufacturing method according to [E01], wherein
the inclined surface which is inclined toward the through-hole is formed in the part of the substrate where the second land part is formed by performing etching to the substrate after the through-hole has been formed.

[E03] The mounting substrate manufacturing method according to [E01] or [E02], wherein
the through-hole is filled with the filling member in a state where a protection film is bonded to the first surface of the substrate.

[E04] The mounting substrate manufacturing method according to any one of [E01] to [E03], wherein
the first component attaching part, the first land part, the second component attaching part, and the second land part are formed on the basis of a combination of physical vapor deposition and an etching technique, and
the through-hole is filled with the filling member on the basis of a printing method.

[E05] The mounting substrate manufacturing method according to any one of [E01] to [E04], wherein
the filling member formed of a conductive material is formed of conductive paste.

[E06] The mounting substrate manufacturing method according to any one of [E01] to [E05], wherein
a thickness of a flat part of the second land part is equal to that of an inclined part of the second land part.

[E07] The mounting substrate manufacturing method according to any one of [E01] to [E06], wherein
when it is assumed that a volume of a part of the through-hole positioned above a top surface of the filling member on the side of the first land part be $V_h$, that a length of a component to be mounted to the first component attaching part be $L_1$, that a shortest distance allowable value from the center of the first land part to a component be $L_0$, and that a maximum allowable value of an inclination of the component to be mounted to the first component attaching part relative to the first surface of the substrate be $\theta_{max}$, the shortest distance allowable value $L_0$ is determined so as to satisfy the following formula (1).

$$\pi \cdot L_1 \cdot \sin(\theta_{max})(L_1^2/3 + L_1 \cdot L_0 + L_0^2) > V_h \qquad (1)$$

[E08] The mounting substrate manufacturing method according to any one of [E01] to [E07], wherein
an inclination angle of the inclined surface inclined toward the through-hole is of 50 to 80 degrees.

[E09] The mounting substrate manufacturing method according to any one of [E01] to [E06], wherein
the inclined surface inclined toward the through-hole is formed in a part of the substrate positioned below the first land part.

[E10] The mounting substrate manufacturing method according to [E09], wherein
a thickness of a flat part of the first land part is equal to that of an inclined part of the first land part.

[E11] The mounting substrate manufacturing method according to any one of [E01] to [E10], wherein
the filling member is extended on the second land part.

[E12] The mounting substrate manufacturing method according to [E11], wherein
the top surface of the filling member is not projected from the level of a top surface of the second component attaching part.

[F01] The mounting substrate manufacturing method according to any one of [D01] to [E12], wherein
the component to be mounted to the first component attaching part is formed of a light emitting element.

[F02] The mounting substrate manufacturing method according to [F01], wherein
a plurality of light emitting elements is arranged in a two-dimensional matrix and forms an image display apparatus.

[F03] The mounting substrate manufacturing method according to any one of [D01] to [E12], wherein
the component to be mounted to the first component attaching part is formed of a sensor.

[F04] The mounting substrate manufacturing method according to any one of [D01] to [F03], wherein
the substrate is formed of a glass substrate.

[G01] <<Component mounting method: First aspect>>
A component mounting method including:
forming a first land part, which surrounds a through-hole, on a first surface of a substrate and a first component attaching part connected to the first land part after the through-hole has been formed in the substrate and forming a second land part, which surrounds the through-hole, on a second surface of the substrate opposed to the first surface and a second component attaching part connected to the second land part and forming a conductive layer, which communicates the first land part with the second land part, on an inner wall of the through-hole; subsequently
forming a solder layer or a solder diffusion prevention layer on a part of the first component attaching part where the component is mounted after a part of the through-hole has been filled with the filling member and subsequently coating flux on the side of the first surface of the substrate; and
mounting the component to the part of the first component attaching part where the component is mounted via the solder layer or the solder diffusion prevention layer, wherein
a shortest distance allowable value from the center of the first land part to the component is determined on the basis of a volume of a part of the through-hole positioned above a top surface of the filling member on the side of the first land part, a length of a component to be mounted to the first component attaching part, and an inclination of the component to be mounted to the first component attaching part relative to the first surface of the substrate (specifically, for example, on the basis of the maximum allowable value of the inclination).

[G02] The component mounting method according to [G01], wherein when it is assumed that the volume of the part of the through-hole positioned above a top surface of the filling member on the side of the first land part be $V_h$, that the length of a component to be mounted to the first component attaching part be $L_1$, that the maximum allowable value of the inclination of the component to be mounted to the first component attaching part relative to the first surface of the substrate be $\theta_{max}$, and that the shortest distance allowable value from the center of the first land part to the component be $L_0$, the shortest distance allowable value $L_0$ is determined so as to satisfy the following formula (1).

$$\pi \cdot L_1 \cdot \sin(\theta_{max})(L_1^2/3 + L_1 \cdot L_0 + L_0^2) > V_h \quad (1)$$

[G03] The component mounting method according to [G02], wherein the value of $\theta_{max}$ is 30 degrees.

[G04] <<Component mounting method: Second aspect>>

A component mounting method including:

forming a first land part, which surrounds a through-hole, on a first surface of a substrate and a first component attaching part connected to the first land part after the through-hole has been formed in the substrate and forming a second land part, which surrounds the through-hole, on a second surface of the substrate opposed to the first surface and a second component attaching part connected to the second land part and forming a conductive layer, which communicates the first land part with the second land part, on an inner wall of the through-hole; subsequently forming a solder layer or a solder diffusion prevention layer on a part of the first component attaching part where the component is mounted after a part of the through-hole has been filled with the filling member and subsequently coating flux having an average thickness d on the side of the first surface of the substrate; and mounting the component to the part of the first component attaching part where the component is mounted via the solder layer or the solder diffusion prevention layer, wherein a shortest distance allowable value $L_0$ is determined so as to satisfy the following formula (2) when it is assumed that a volume of a part of the through-hole positioned above a top surface of the filling member on the side of the first land part be $V_h$ and that the shortest distance allowable value from the center of the first land part to the component be $L_0$.

$$\pi \cdot d \cdot L_0^2 > V_h \quad (2)$$

[G05] The component mounting method according to any one of [G01] to [G04], wherein the first land part, the second land part, the first component attaching part, the second component attaching part, and the conductive layer are formed of a first member formed of metal or alloy, and the filling member is formed of a second member different from the first member.

[G06] The component mounting method according to [G05], wherein when it is assumed that a coefficient of thermal expansion of the substrate be $CTE_0$, that a coefficient of thermal expansion of the first member be $CTE_1$, and that a coefficient of thermal expansion of the second member be $CTE_2$, $CTE_2 - CTE_0 < CTE_1 - CTE_0$ or $CTE_0 < CTE_1 < CTE_2$ is satisfied.

[G07] The component mounting method according to [G05], wherein the first member is formed of at least one kind of material selected from a group including aluminum, aluminum alloy, nickel, nickel alloy, chrome, and chromium alloy, and the second member is formed of conductive paste.

[G08] The component mounting method according to any one of [G01] to [G07], wherein the first component attaching part, the first land part, the second component attaching part, the second land part, and the conductive layer are formed on the basis of a combination of physical vapor deposition and an etching technique, and the through-hole is filled with the filling member on the basis of a printing method.

[G09] The component mounting method according to any one of [G01] to [G08], wherein the through-hole is filled with the filling member in a state where a protection film is bonded to the first surface of the substrate.

[G10] The component mounting method according to any one of [G01] to [G09], wherein an inclined surface which is inclined toward the through-hole is formed in apart of the substrate where the second land part is formed when the through-hole is formed.

[G11] The component mounting method according to [G10], wherein a thickness of a flat part of the second land part is equal to that of an inclined part of the second land part.

[H01] The component mounting method according to any one of [G01] to [G11], wherein the component to be mounted to the first component attaching part is formed of a light emitting element.

[H02] The component mounting method according to [H01], wherein a plurality of light emitting elements is arranged in a two-dimensional matrix and forms an image display apparatus.

[H03] The component mounting method according to any one of [G01] to [G11], wherein the component to be mounted to the first component attaching part is formed of a sensor.

[H04] The component mounting method according to any one of [G01] to [H03], wherein the substrate is formed of a glass substrate.

REFERENCE SIGNS LIST 10 substrate
10' part of substrate where second land part is formed
11 first surface of substrate
12 second surface of substrate
13 through-hole
13' part (space) of through-hole positioned above top surface of filling member on side of first land part
13" part (space) of through-hole positioned above top surface of filling member on side of second land part
14 conductive layer
15, 65 filling member
16 protection film
17 inclined surface
17' flat part
18 coating layer
21 first land part
22, 23 first component attaching part
24 solder layer
31 second land part
32, 33 second component attaching parts 32 and 33
34 solder layer
40, 40' flux
51 component (first component)

52 connection terminal part and the like provided in a component (first component)
100 ground

The invention claimed is:

1. A mounting substrate comprising:
a through-hole configured to be formed in a substrate;
a first land part configured to be formed on a first surface of the substrate and surround the through-hole;
a second land part configured to be formed on a second surface of the substrate opposed to the first surface and surround the through-hole;
a first component attaching part configured to be formed on the first surface of the substrate and be connected to the first land part;
a second component attaching part configured to be formed on the second surface of the substrate and be connected to the second land part;
a conductive layer configured to be formed on an inner wall of the through-hole and communicate the first land part with the second land part; and
a filling member configured to be filled into a part of the through-hole, wherein
a shortest distance allowable value from the center of the first land part to a component is determined on the basis of a volume of a part of the through-hole positioned above a top surface of the filling member on the side of the first land part, a length of a component to be mounted to the first component attaching part, and an inclination of the component to be mounted to the first component attaching part relative to the first surface of the substrate.

2. The mounting substrate according to claim 1, wherein when it is assumed that the volume of the part of the through-hole positioned above the top surface of the filling member on the side of the first land part be $V_h$, that a length of the component to be mounted to the first component attaching part be $L_1$, that the maximum allowable value of an inclination of the component to be mounted to the first component attaching part relative to the first surface of the substrate be $\theta_{max}$, and that the shortest distance allowable value from the center of the first land part to the component be $L_0$, the shortest distance allowable value $L_0$ is determined so as to satisfy the following formula (1)

$$\pi \cdot L_1 \cdot \sin(\theta_{max})(L_1^2/3 + L_1 \cdot L_0 + L_0^2) > V_h \tag{1}$$

3. The mounting substrate according to claim 2, wherein the value of $\theta_{max}$ is 30 degrees.

4. The mounting substrate according to claim 1, wherein the first land part, the second land part, the first component attaching part, the second component attaching part, and the conductive layer are formed of a first member formed of metal or alloy, and the filling member is formed of a second member different from the first member.

5. The mounting substrate according to claim 1, wherein the component to be mounted to the first component attaching part is formed of a light emitting element.

6. The mounting substrate according to claim 1, wherein the substrate is formed of a glass substrate.

7. A mounting substrate including:
a through-hole configured to be formed in a substrate;
a first land part configured to be formed of a first surface of the substrate and surround the through-hole;
a second land part configured to be formed on a second surface of the substrate opposed to the first surface and surround the through-hole;
a first component attaching part configured to be formed on the first surface of the substrate and be connected to the first land part;
a second component attaching part configured to be formed on the second surface of the substrate and be connected to the second land part;
a conductive layer configured to be formed on an inner wall of the through-hole and communicate the first land part with the second land part; and
a filling member configured to be filled into a part of the through-hole, wherein
flux having an average thickness d is coated on a side of the first surface of the substrate, and
when it is assumed that the volume of the part of the through-hole positioned above a top surface of the filling member on the side of the first land part be $V_h$ and that a shortest distance allowable value from the center of the first land part to a component be $L_0$, the shortest distance allowable value $L_0$ is determined so as to satisfy the following formula (2)

$$\pi \cdot d \cdot L_0^2 > V_h \tag{2}$$

8. A mounting substrate including:
a through-hole configured to be formed in a substrate;
a first land part configured to be formed on a first surface of the substrate and surround the through-hole;
a second land part configured to be formed on a second surface of the substrate opposed to the first surface and surround the through-hole;
a first component attaching part configured to be formed on the first surface of the substrate and be connected to the first land part;
a second component attaching part configured to be formed on the second surface of the substrate and be connected to the second land part; and
a filling member configured to be formed of a conductive material and be filled into the through-hole and communicate the first land part with the second land part, wherein
an inclined surface which is inclined toward the through-hole is formed in a part of the substrate positioned below the second land part.

9. The mounting substrate according to claim 8, wherein a thickness of a flat part of the second land part is equal to that of an inclined part of the second land part.

10. The mounting substrate according to claim 8, wherein when it is assumed that the volume of the part of the through-hole positioned above a top surface of the filling member on the side of the first land part be $V_h$, that a length of a component to be mounted to the first component attaching part be $L_1$, that the maximum allowable value of an inclination of the component to be mounted to the first component attaching part relative to the first surface of the substrate be $\theta_{max}$, and that the shortest distance allowable value from the center of the first land part to the component be $L_0$, the shortest distance allowable value $L_0$ is determined so as to satisfy the following formula (1)

$$\pi \cdot L_1 \cdot \sin(\theta_{max})(L_1^2/3 + L_1 \cdot L_0 + L_0^2) > V_h \tag{1}$$

11. A mounting substrate manufacturing method comprising:
forming a first land part, which surrounds a through-hole, on a first surface of a substrate and a first component attaching part connected to the first land part after the through-hole has been formed in the substrate and forming a second land part, which surrounds the through-hole, on a second surface of the substrate opposed to the first surface and a second component attaching part connected to the second land part and forming a conductive layer, which communicates the first land part with the second land part, on an inner wall of the through-hole; and subsequently filling a filling member into a part of the through-hole, wherein a shortest distance allowable value from the center of the first land part to a component is determined on the basis of a volume of a part of the through-hole positioned above a top surface of the filling member on the side of the first land part, a length of a component to be mounted to the first component attaching part, and an inclination of the component to be mounted to the first component attaching part relative to the first surface of the substrate.

12. The mounting substrate manufacturing method according to claim 11, wherein
the first component attaching part, the first land part, the second component attaching part, the second land part, and the conductive layer are formed on the basis of a combination of physical vapor deposition and an etching technique, and
the through-hole is filled with the filling member on the basis of a printing method.

13. The mounting substrate manufacturing method according to claim 11, wherein
the through-hole is filled with the filling member in a state where a protection film is bonded to the first surface of the substrate.

14. The mounting substrate manufacturing method according to claim 11, wherein
an inclined surface which is inclined toward the through-hole is formed in a part of the substrate where the second land part is formed when the through-hole is formed.

15. A mounting substrate manufacturing method including:
forming a first land part, which surrounds a through-hole, on a first surface of a substrate and a first component attaching part connected to the first land part after the through-hole has been formed in the substrate and forming a second land part, which surrounds the through-hole, on a second surface of the substrate opposed to the first surface and a second component attaching part connected to the second land part and forming a conductive layer, which communicates the first land part with the second land part, on an inner wall of the through-hole; subsequently
filling a filling member into a part of the through-hole, and
coating flux having an average thickness d on a side of the first surface of the substrate after a part of the through-hole has been filled with the filling member, wherein
a shortest distance allowable value $L_0$ is determined so as to satisfy the following formula (2) when it is assumed that a volume of a part of the through-hole positioned above a top surface of the filling member on the side of the first land part be $V_h$ and that a shortest distance allowable value from the center of the first land part to the component be $L_0$ $$\pi \cdot d \cdot L_0^2 > V_h \qquad (2).$$

16. A mounting substrate manufacturing method including:
forming a first land part, which surrounds a through-hole, on a first surface of a substrate and a first component attaching part connected to the first land part after the through-hole has been formed in the substrate and forming a second land part, which surrounds the through-hole, on a second surface of the substrate opposed to the first surface and a second component attaching part connected to the second land part; and subsequently
communicating the first land part with the second land part by subsequently filling the through-hole with a filling member formed of a conductive material, wherein
an inclined surface which is inclined toward the through-hole is formed in a part of the substrate where the second land part is formed.

17. The mounting substrate manufacturing method according to claim 16, wherein
the inclined surface which is inclined toward the through-hole is formed in the part of the substrate where the second land part is formed by performing etching to the substrate after the through-hole has been formed.

18. The mounting substrate manufacturing method according to claim 16, wherein
the through-hole is filled with the filling member in a state where a protection film is bonded to the first surface of the substrate.

19. A component mounting method comprising:
forming a first land part, which surrounds a through-hole, on a first surface of a substrate and a first component attaching part connected to the first land part after the through-hole has been formed in the substrate and forming a second land part, which surrounds the through-hole, on a second surface of the substrate opposed to the first surface and a second component attaching part connected to the second land part and forming a conductive layer, which communicates the first land part with the second land part, on an inner wall of the through-hole; subsequently
forming a solder layer or a solder diffusion prevention layer on a part of the first component attaching part where the component is mounted after a part of the through-hole has been filled with the filling member; subsequently
coating flux on the side of the first surface of the substrate; and
mounting the component to the part of the first component attaching part where the component is mounted via the solder layer or the solder diffusion prevention layer, wherein
a shortest distance allowable value from the center of the first land part to the component is determined on the basis of a volume of a part of the through-hole positioned above a top surface of the filling member on the side of the first land part, a length of a component to be mounted to the first component attaching part, and an inclination of the component to be mounted to the first component attaching part relative to the first surface of the substrate.

20. A component mounting method including:
forming a first land part, which surrounds a through-hole, on a first surface of a substrate and a first component attaching part connected to the first land part after the through-hole has been formed in the substrate and forming a second land part, which surrounds the through-hole, on a second surface of the substrate opposed to the first surface and a second component attaching part connected to the second land part and forming a conductive layer, which communicates the first land part with the second land part, on an inner wall of the through-hole; subsequently forming a solder layer or a solder diffusion prevention layer on a part of the first component attaching part where the component is mounted after a part of the through-hole has been filled with the filling member and subsequently coating flux having an average thickness d on the side of the first surface of the substrate; and mounting the component to the part of the first component attaching part where the component is mounted via the solder layer or the solder diffusion prevention layer, wherein a shortest distance allowable value $L_0$ is determined so as to satisfy the following formula (2) when it is assumed that a volume of a part of the through-hole positioned above a top surface of the filling member on the side of the first land part be $V_h$ and that the shortest distance allowable value from the center of the first land part to the component be $L_0$ $$\pi \cdot d \cdot L_0^2 > V_h \qquad (2).$$

* * * * *